United States Patent
Kitane et al.

(10) Patent No.: US 8,436,611 B2
(45) Date of Patent: May 7, 2013

(54) MAGNETIC RESONANCE IMAGING (MRI) USING SPIR AND/OR CHESS SUPPRESSION PULSES

(75) Inventors: Shinichi Kitane, Otawara (JP); Mitsue Miyazaki, Otawara (JP); Yuichi Yamashita, Otawara (JP)

(73) Assignees: Kabushiki Kaisha Toshiba, Minato-Ku, Tokyo (JP); Toshiba Medical Systems Corporation, Otawara-Shi, Tochigi-Ken (JP)

(*) Notice: Subject to any disclaimer, the term of this patent is extended or adjusted under 35 U.S.C. 154(b) by 421 days.

(21) Appl. No.: 12/662,266

(22) Filed: Apr. 8, 2010

(65) Prior Publication Data

US 2010/0194388 A1 Aug. 5, 2010

Related U.S. Application Data

(62) Division of application No. 12/052,274, filed on Mar. 20, 2008, now Pat. No. 8,076,935.

(30) Foreign Application Priority Data

Mar. 27, 2007 (JP) ................................. 2007-081640

(51) Int. Cl.
*G01V 3/00* (2006.01)
(52) U.S. Cl.
USPC .......................................... 324/307; 324/309
(58) Field of Classification Search .......... 324/300–322; 600/407–445
See application file for complete search history.

(56) References Cited

U.S. PATENT DOCUMENTS

| | | | |
|---|---|---|---|
| 5,159,550 A * | 10/1992 | Sakamoto et al. | 600/410 |
| 5,657,758 A | 8/1997 | Posse et al. | |
| 5,709,208 A | 1/1998 | Posse et al. | |
| 5,729,138 A | 3/1998 | Purdy et al. | |
| 5,842,989 A * | 12/1998 | Zur | 600/410 |
| 5,879,299 A | 3/1999 | Posse et al. | |
| 6,091,242 A * | 7/2000 | Hanawa | 324/307 |
| 6,275,040 B1 | 8/2001 | Zur | |
| 6,320,377 B1 | 11/2001 | Miyazaki et al. | |
| 6,806,706 B2 | 10/2004 | Gurr | |
| 7,420,368 B2 | 9/2008 | Miyazaki | |

(Continued)

FOREIGN PATENT DOCUMENTS

| | | |
|---|---|---|
| JP | 11-216126 | 8/1999 |
| JP | 2000-005142 | 1/2000 |
| JP | 2005-152534 | 6/2005 |
| JP | 2005-270327 | 10/2005 |

OTHER PUBLICATIONS

Final Office Action mailed Feb. 4, 2011, in U.S. Appl. No. 12/052,274.

(Continued)

*Primary Examiner* — Brij Shrivastav
(74) *Attorney, Agent, or Firm* — Nixon & Vanderhye PC

(57) ABSTRACT

A magnetic resonance imaging apparatus includes an imaging condition setting unit and an image data acquisition unit. The imaging condition setting unit sets an imaging condition applying first and second suppression pulses of which at least ones of types, center frequencies and frequency bands are different from each other. The first and the second suppression pulses frequency-selectively suppress at least one of fat and silicone. The image data acquisition unit acquires image data according to the imaging condition.

20 Claims, 19 Drawing Sheets

U.S. PATENT DOCUMENTS

| | | | |
|---|---|---|---|
| 7,663,365 B2 * | 2/2010 | Kanazawa | 324/309 |
| 8,076,935 B2 * | 12/2011 | Kitane et al. | 324/307 |
| 2008/0265884 A1 | 10/2008 | Miyazaki | |
| 2010/0194388 A1 * | 8/2010 | Kitane et al. | 324/309 |
| 2012/0119740 A1 * | 5/2012 | Takahashi et al. | 324/309 |

OTHER PUBLICATIONS

Notice of Allowance mailed Aug. 25, 2011, in U.S. Appl. No. 12/052,274.

Office Action dated Nov. 13, 2012 in JP 2008-013792.

* cited by examiner

MAGNETIC RESONANCE IMAGING (MRI) USING SPIR AND/OR CHESS SUPPRESSION PULSES

CROSS-REFERENCE TO RELATED APPLICATIONS

This is a division of application Ser. No. 12/052,274 filed Mar. 20, 2008 (now U.S. Pat. No. 8,076,935), which claims priority under 35 U.S.C. §119 based on Japanese Patent Application No. 2007-081640 filed Mar. 27, 2007, the entire contents of both of which are incorporated herein by reference.

BACKGROUND OF THE INVENTION

1. Field of the Invention

The present invention relates to an MRI (magnetic resonance imaging) apparatus and a magnetic resonance imaging method which radio excites nuclear spins of an object magnetically with an RF (radio frequency) signal having the Larmor frequency and reconstructs an image based on an NMR (nuclear magnetic resonance) signal generated due to the excitation and, more particularly, to a magnetic resonance imaging apparatus and a magnetic resonance imaging method which make it possible to image under a suppression method for suppressing a target signal from a material such as fat or silicone.

2. Description of Related Art

Magnetic resonance imaging is an imaging method which excites nuclear spins of an object set in a static magnetic field with an RF signal having the Larmor frequency magnetically and reconstructs an image based on an NMR signal generated due to the excitation.

In the field of magnetic resonance imaging, there is a fat saturation method to acquire signals while suppressing signals from fat (fat signals). Conventionally, fat saturation methods used widely in general include CHESS (chemical shift selective) method, SPIR (spectral presaturation with inversion recovery) method (called SPECIR as well) and STIR (short TI inversion recovery) method.

In fat saturation methods, the CHESS method is called a selective fat saturation method since the CHESS method is a method to suppress only fat signals frequency-selectively using 3.5 ppm difference in resonant frequencies between water protons and fat protons (see, for example, Japanese Patent Application (Laid-Open) No. 7-327960, Japanese Patent Application (Laid-Open) No. 9-182729 and Japanese Patent Application (Laid-Open) No. 11-299753).

FIG. 1 is a diagram explaining a method for suppressing fat signals under a conventional CHESS method.

In FIG. 1, the abscissa denotes a frequency and the ordinate denotes a signal intensity of NMR signal. In a frequency selective fat saturation method, a static magnetic field is made uniform by shimming prior to imaging. As shown in FIG. 1, respective protons of water and fat have 3.5 ppm difference in a resonant frequency and, therefore, a peak of frequencies of fat signals becomes sharp when the uniformity of a static magnetic field is obtained enough by shimming. Then, when a fat saturation RF pulse with a 90 degree flip angle (FA) and a frequency matching a resonant frequency of fat, i.e., a CHESS pulse is applied to tilt only longitudinal magnetization of fat protons by 90 degree frequency-selectively and, subsequently, magnetization of fat protons substantially disappears by using a spoiler pulse previous to data acquisition, fat signals can be suppressed. As described above, the CHESS method is effective in fat saturation on a region with high uniformity with regard to a static magnetic field.

The SPIR method is also a selective fat saturation method that uses a difference in resonance frequencies between water protons and fat protons (see, for example, Japanese Patent Application (Laid-Open) No. 2006-149583).

FIG. 2 is a diagram explaining a method for suppressing fat signals under a conventional SPIR method. FIG. 3 is a diagram showing a TI for applying a pulse for excitation after applying the SPIR pulse shown in FIG. 2.

In FIG. 2, the abscissa denotes a frequency and the ordinate denotes a signal intensity of MR signal. Further, in FIG. 3, the abscissa denotes an elapsed time after applying an SPIR pulse and the ordinate denotes a longitudinal magnetization z of a proton spin.

In the SPIR method, an SPIR pulse which is a frequency-selective inversion RF pulse having a frequency matching with a resonant frequency of fat signals is applied. A FA of an SPIR pulse is set from 90 degrees to 180 degrees. When an SPIR pulse is applied, the proton spins in fat magnetized by a static magnetic field tilt by the angle according to the FA and a longitudinal magnetization z of the proton spins in fat shows a minus value. Accordingly, the longitudinal magnetization z of proton spins increases with time to show a plus value by longitudinal relaxation (T1 relaxation). Then, with setting an inversion time (TI) to the timing which a longitudinal magnetization z in fat reaches the null point by T1 relaxation after applying an SPIR pulse, an RF pulse for excitation of water signals is applied. This allows only water signals to be excited selectively.

In the SPIR method, if an angle to tilt proton spins in fat, i.e., suppression effect is set largely like the case that a FA of an SPIR pulse is set to 180 degrees, for example, to suppress fat signals is easy even in a fat region having a resonant frequency band with a broad base. Thus, since a FA of an SPIR pulse is larger than a FA of 90 degree pulse, an SPIR pulse has a larger frequency band to be able to suppress fat signals than that of a normal CHESS pulse. In the SPIR method, since there is a dead time TI until the application timing of an RF pulse for excitation after to an application of an SPIR pulse, the waveform of an SPIR pulse can be better approximated to a rectangle.

In the SPIR method, though it is necessary to acquire data after a TI which is the time until an intensity of fat signal (a longitudinal magnetization z of a proton) becomes the null point, the TI can be also shortened by reducing a FA of an SPIR pulse. Generally, a TI is approximately from 150 ms to 180 ms in a 1.5 T MRI apparatus and a TI is approximately from 200 ms to 250 ms in a 3 T MRI apparatus.

On the other hand, the STIR method is a fat saturation method to use a difference in T1 relaxation times between fat and water signals and is a non-selective fat saturation method. Therefore, in the STIR method, shimming is unnecessary. In the STIR method, a region including a fat region and a water region is excited by a STIR pulse with a 180 degree FA. As shown in FIG. 2, the T1 relaxation time of water shown with the dotted line is longer than the T1 relaxation time of fat. Then, the timing which a longitudinal magnetization z in fat protons becomes the null point is set to the TI and an RF pulse for excitation is applied. Then, after a lapse of the TI, a longitudinal magnetization z of water protons does not reach the null point yet and only water protons can be excited selectively.

However, since a CHESS pulse is an RF pulse with a 90 degree FA, when uniformity of static magnetic fields in a water region and a fat region is not satisfactory, fat signals cannot be suppressed sufficiently.

FIG. 4 is a diagram showing an example case of insufficiently suppressed fat signals in case of performing fat-saturation under a conventional CHESS method.

In FIG. 4, the abscissa denotes a frequency and the ordinate denotes a signal intensity of NMR signal.

As shown in FIG. 4, when the uniformity of the static magnetic field does not become satisfactory even if shimming is performed, the base of a resonant frequency in fat becomes wide. Specifically, in a region showing a large susceptibility such as a breast and a jaw, there is a trend in which a band of fat signals extends in the frequency direction. Therefore, even if a CHESS pulse with a 90 degree FA is applied, component of fat signals remains as indicated by arrows. Thus, the CHESS method has a disadvantage that it is difficult to suppress fat signals extending in a wide frequency band sufficiently in the case of an uneven static magnetic field.

FIG. 5 is a tomographic image of an object obtained with a non-uniform static magnetic field under a conventional CHESS method.

As shown in FIG. 5, in the case of an uneven static magnetic field, it is recognized that fat signals are not suppressed sufficiently and a fat region is depicted on a tomographic image of an object.

In the conventional SPIR method, when a longitudinal magnetization of fat protons does not become the null point with the result that the adjustments of a TI and a FA of fat saturation pulse are not appropriate, unsuppressed fat signals remain. Note that whether or not fat signals show null changes depending on a T1 value of fat. Therefore, when it is assumed that a T1 of fat value and TI are fixed, adjusting for a FA of a fat saturation pulse allows fat signals to show null logically. However, practically, fat signals often remain by the factors such as non-uniformity of a magnetic field, non-uniformity of an RF power (FA) of a fat saturation pulse and a subtle difference in a T1 value of fat within a living body.

FIG. 6 is a diagram showing an example case of fat signals remaining due to an inadequately adjusted TI or FA of a fat-saturation pulse under a conventional SPIR method.

In FIG. 6, the abscissa denotes a frequency and the ordinate denotes a signal intensity of NMR signal. In the SPIR method, in the case that the adjustment of a TI and a power of a fat saturation pulse is incomplete or by the factors such as influence of non-uniformity of a magnetic field and an RF power (FA) of a fat saturation pulse and a subtle difference in a T1 value within a living body even if a TI and a power of a fat saturation pulse are adjusted, fat signals remain as shown in FIG. 6. Further, the SPIR method has the disadvantage to obtain sufficient fat saturation effect at only a region showing a high uniformity with regard to a static magnetic field like the CHESS method.

FIG. 7 is a tomographic image of an object obtained with an inadequately adjusted FA of a fat-saturation pulse under a conventional SPIR method.

FIG. 7 shows an image obtained by setting a TI to be the shortest and adjusting a FA of a fat saturation pulse so that fat signals show null. As shown in FIG. 7, the fat saturation effect by the conventional SPIR method is better than that by the CHESS method. However, it is recognized that a fat region is depicted on the tomographic image of an object without suppressing fat signals sufficiently by the factors described above even if a FA of a fat saturation pulse is adjusted.

Although shimming is unnecessary since the STIR method is not a fat saturation method to suppress fat signals frequency-selectively, intensities of water signals to be acquired become low due to acquisition of the water signals subsequently to a lapse of a TI. Therefore, in the STIR method, there are problems that the SNR (noise-to-signal ratio) decreases and a decrease of the SNR leads to extension of an imaging time.

As mentioned above, in a conventional frequency selective fat saturation method, when uniformity of a static magnetic field cannot be obtained satisfactorily due to the influence of the shape of an imaging part like the case of imaging a region such as a jaw part and a breast, it is difficult to suppress fat signals sufficiently. On the other hand, in a conventional non-frequency selective fat saturation method, the intensities of water signals to be acquired decrease and an imaging time becomes long.

In addition, in the conventional frequency selective fat saturation method, when a parenchymal part of an object is to be suppressed, plural excitation pulses are applied repeatedly under the condition that each frequency of excitation pulse is matched with a resonant frequency of water. However, in the case of a high-speed imaging, an application interval of an excitation pulse becomes long and signal recovery from an imaging target occurs due to the influence of a longitudinal magnetization. Consequently, the suppression effect in the frequency direction by an excitation pulse does not become constant and the suppression effect of signals cannot be obtained sufficiently depending on a set frequency of an excitation pulse.

That is, though the suppression effect of fat signals can be evaluated by a slice profile showing signal intensity to a frequency variation of an excitation pulse, the profile changes according to an application interval of an excitation pulse. For example, in the case that data acquisition is performed using a sequence of FFE (fast field echo) type under the segment k-space method, if the number of segments is increased, the profile showing the suppression effect of fat signals is improved since an application interval of an excitation pulse becomes short; on the contrary, if the number of segments is decreased, a satisfactory profile cannot be obtained since an application interval of an excitation pulse becomes long.

Note that the segmented k-space method is a data acquisition method which segments data in k-space into several areas (segmentalization) and retrieves data from every segment sequentially. Therefore, the number of segments is equivalent to a number of divisions of phase encoding (PE) in k-space.

FIG. 8 is a diagram showing a profile representing a simulation result of the effect by conventional fat-saturation methods.

In FIG. 8, the abscissa denotes a frequency shift amount (ppm) of an excitation pulse from a resonance frequency of fat and the ordinate denotes a relative signal intensity of an echo signal in case of setting the maximum values as 1.

As shown in FIG. 8, it is confirmable that the profile in the case that the number of segments is two has more deteriorated stability of fat saturation effect in the frequency direction than the profile in the case that the number of segments is sixty-four since an application interval of an excitation pulse in the case that the number of segments is two is longer than that in the case that the number of segments is sixty-four.

Therefore, adjusting a waveform of an excitation pulse is needed in order to improve a slice profile showing the fat saturation effect. For example, when an excitation pulse has a sinc waveform, a waveform control such as expansion and contraction of an excitation pulse wavelength and change of a side lobe shape are necessary.

Though signals from an arbitrary matter such as water and silicone as well as signals from fat can be also suppressed, there is a problem as described above in the case that signals from a matter except fat are suppressed as well.

SUMMARY OF THE INVENTION

The present invention has been made in light of the conventional situations, and it is an object of the present invention to provide a magnetic resonance imaging apparatus and a magnetic resonance imaging method which make it possible to perform frequency-selective-suppression for acquiring a signal which should be acquired with higher signal intensity while more satisfactorily suppressing a signal which should be suppressed.

The present invention provides a magnetic resonance imaging apparatus comprising: an imaging condition setting unit configured to set an imaging condition applying a first suppression pulse and a second suppression pulse of which at least ones of types, center frequencies and frequency bands are different from each other, the first and the second suppression pulses each frequency-selectively suppressing at least one of fat and silicone; and an image data acquisition unit configured to acquire image data according to the imaging condition, in an aspect to achieve the object.

The present invention also provides a magnetic resonance imaging apparatus comprising: an imaging condition setting unit configured to set an imaging condition applying a first suppression pulse and a second suppression pulse of which at least ones of types, center frequencies and frequency bands are different from each other, the first and the second suppression pulses each frequency-selectively suppressing target signals; and an image data acquisition unit configured to acquire image data according to the imaging condition, in an aspect to achieve the object.

The present invention also provides a magnetic resonance imaging apparatus comprising: an imaging unit configured to perform imaging after applying mutually different types of fat-saturation pulse; and a reconstruction unit configured to reconstruct an image based on magnetic resonance signals obtained by the imaging, in an aspect to achieve the object.

The present invention also provides a magnetic resonance imaging apparatus comprising: an imaging unit configured to perform imaging applying an excitation pulse for exciting a magnetization of water after applying a first fat-saturation pulse for inclining a magnetization of fat into an angle of 90 degrees to 180 degrees and a second fat-saturation pulse for the magnetization of the fat into an angle of 90 degrees to 180 degrees; and a reconstruction unit configured to reconstruct an image based on magnetic resonance signals obtained by the imaging, in an aspect to achieve the object.

The present invention also provides a magnetic resonance imaging method comprising: performing imaging after applying mutually different types of fat-saturation pulse; and reconstructing an image based on magnetic resonance signals obtained by the imaging, in an aspect to achieve the object.

The magnetic resonance imaging apparatus and the magnetic resonance imaging method as described above make it possible to perform frequency-selective-suppression for acquiring a signal which should be acquired with higher signal intensity while more satisfactorily suppressing a signal which should be suppressed.

DESCRIPTION OF EXEMPLARY EMBODIMENTS

A magnetic resonance imaging apparatus and a magnetic resonance imaging method according to exemplary embodiments of the present invention will be described with reference to the accompanying drawings.

Figure 1:
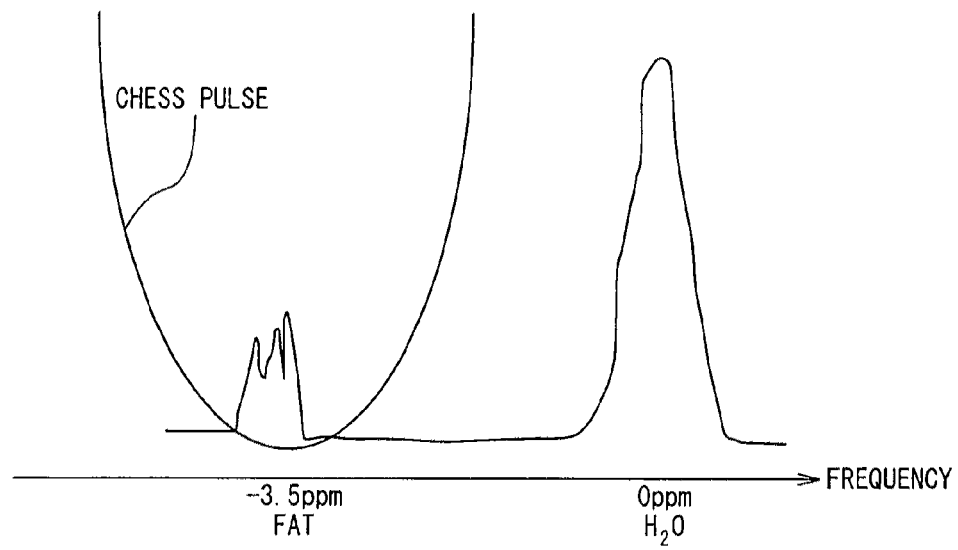
FIG. 1 is a diagram explaining a method for suppressing fat signals under a conventional CHESS method.
Figure 2:
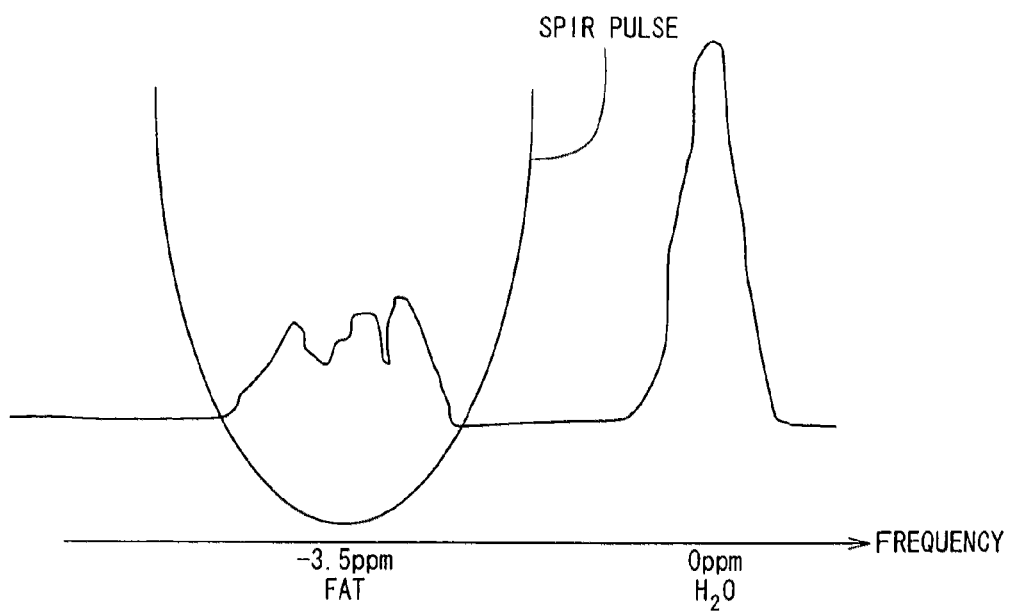
FIG. 2 is a diagram explaining a method for suppressing fat signals under a conventional SPIR method.
Figure 3:
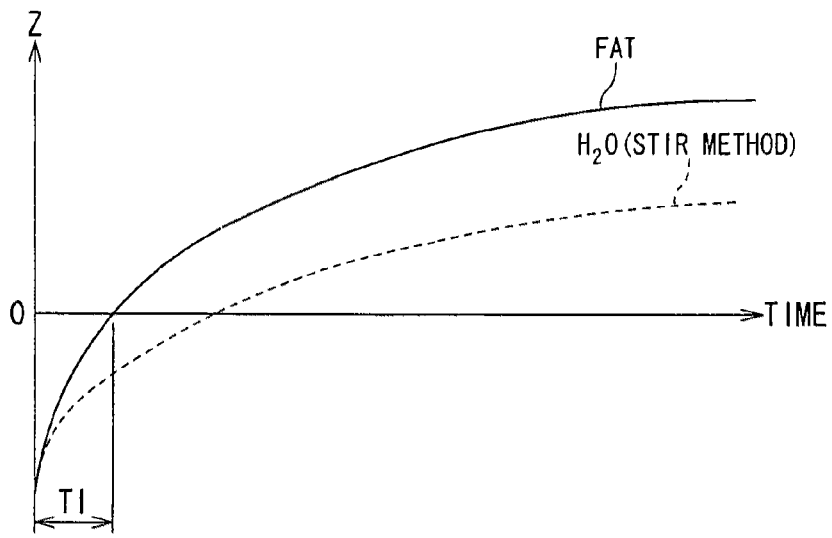
FIG. 3 is a diagram showing a TI for applying a pulse for excitation after applying the SPIR pulse shown in FIG. 2.
Figure 4:
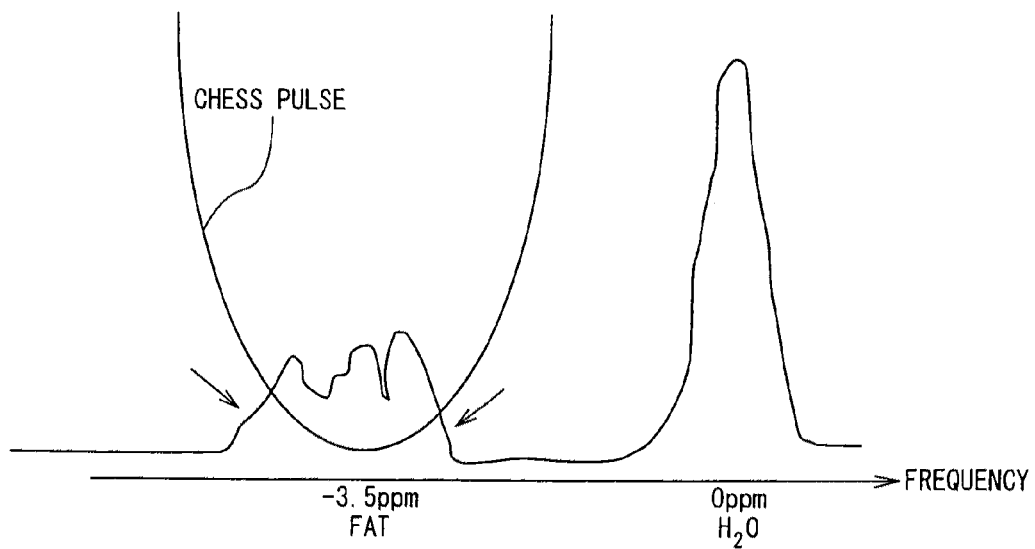
FIG. 4 is a diagram showing an example case of insufficiently suppressed fat signals in case of performing fat-saturation under a conventional CHESS method.
Figure 5:
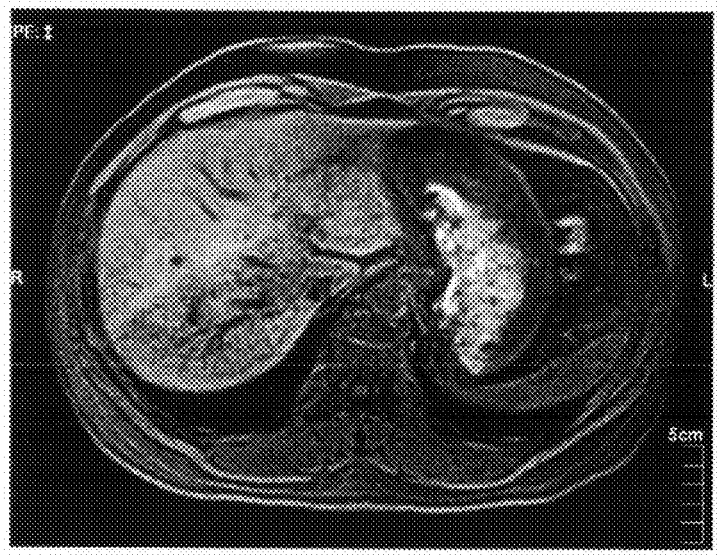
FIG. 5 is a tomographic image of an object obtained with a non-uniform static magnetic field under a conventional CHESS method.
Figure 6:
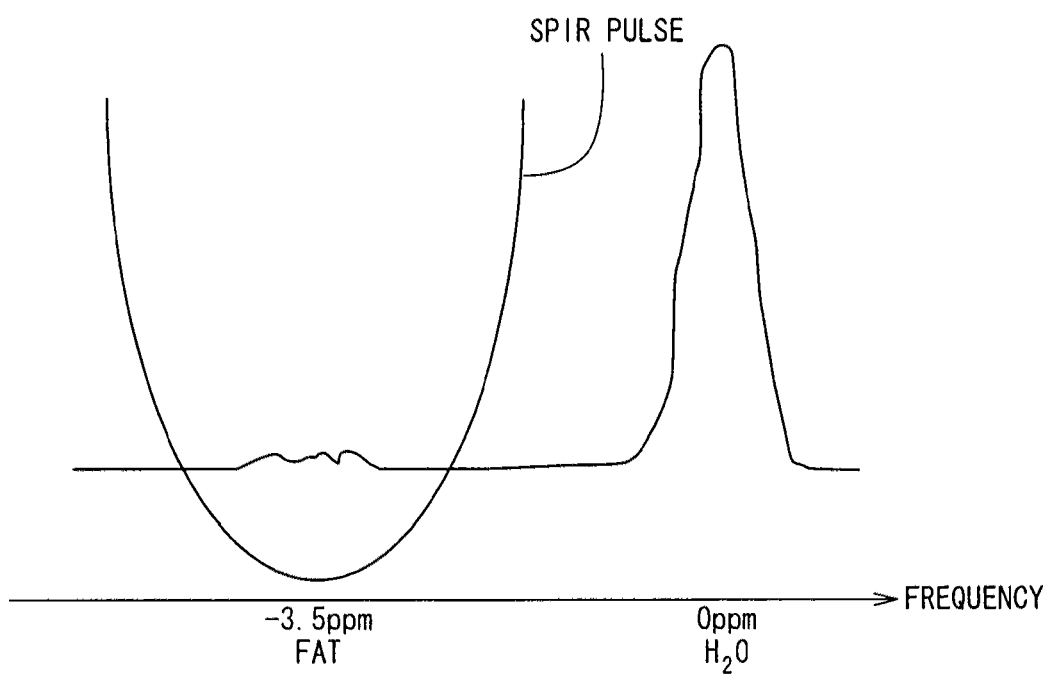
FIG. 6 is a diagram showing an example case of fat signals remaining due to an inadequately adjusted TI or FA of a fat-saturation pulse under a conventional SPIR method.
Figure 7:
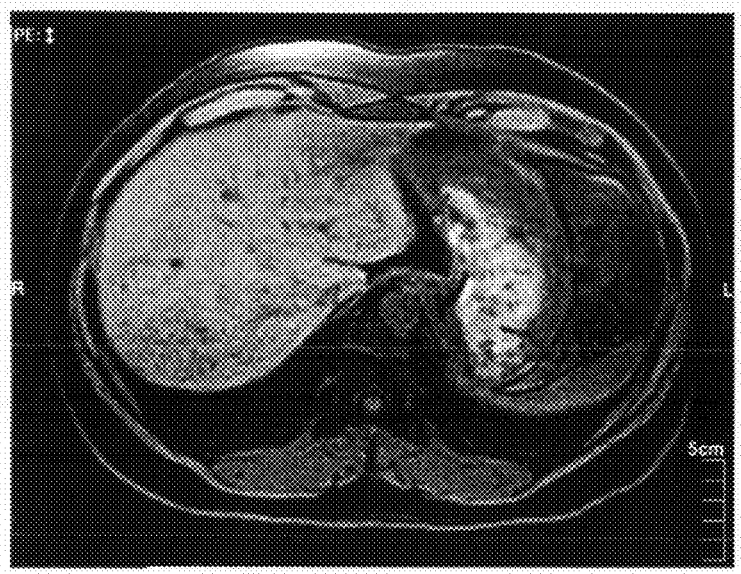
FIG. 7 is a tomographic image of an object obtained with an inadequately adjusted FA of a fat-saturation pulse under a conventional SPIR method.
Figure 8:
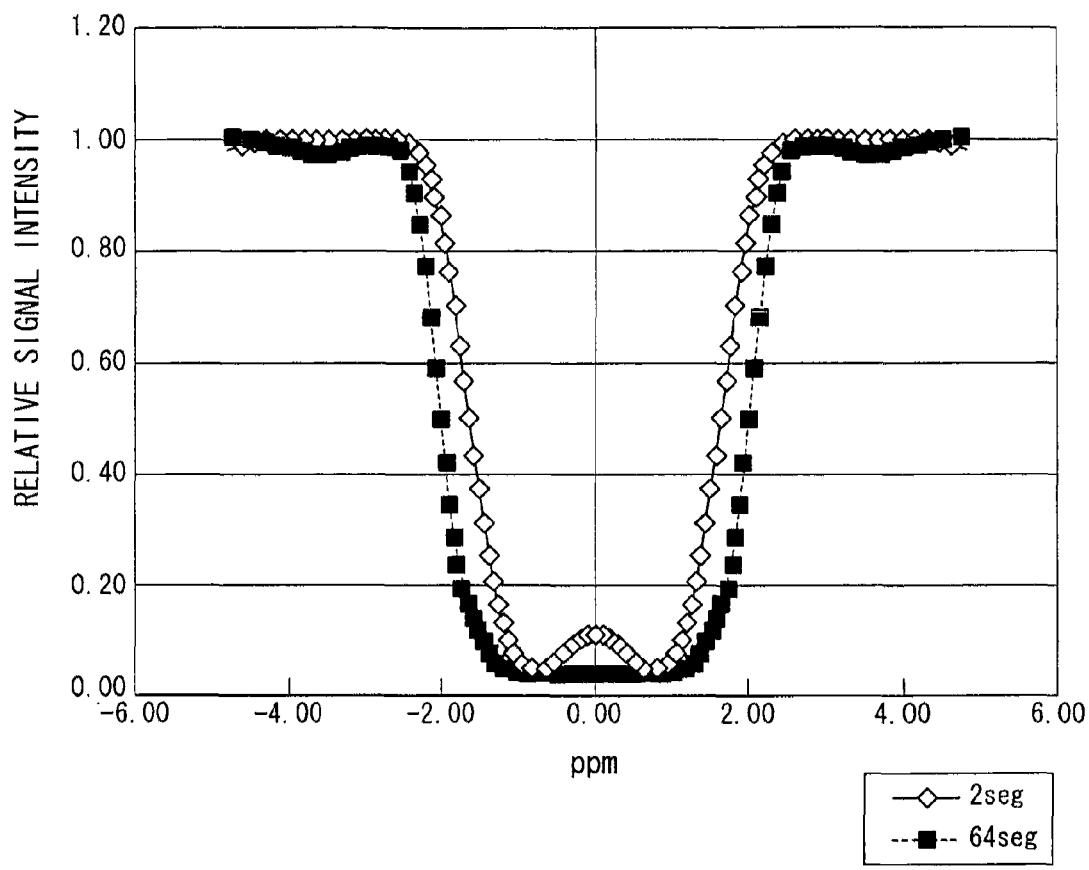
FIG. 8 is a diagram showing a profile representing a simulation result of effect by a conventional fat-saturation method.
Figure 9:
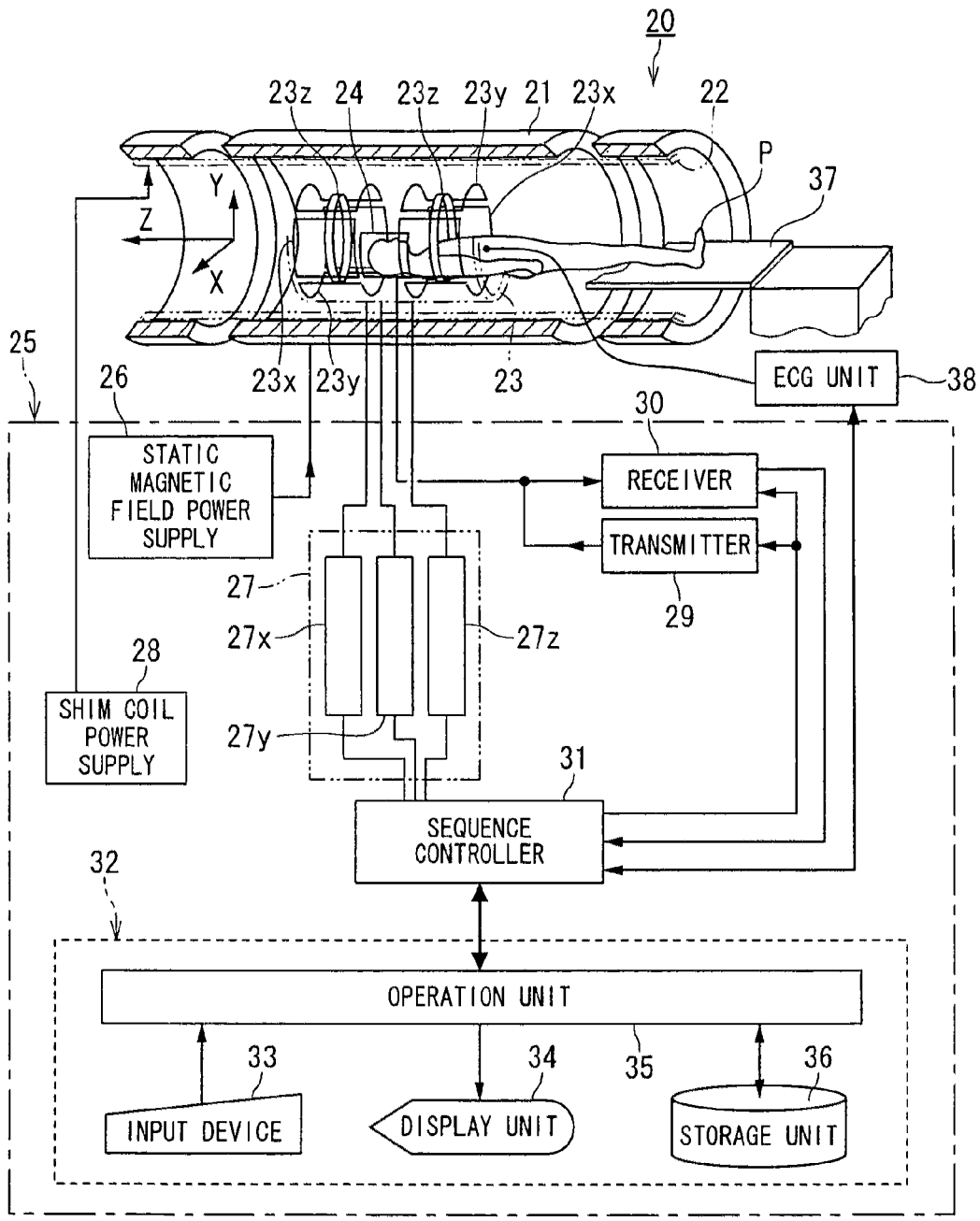
FIG. 9 is a block diagram showing a magnetic resonance imaging apparatus according to an exemplary embodiment of the present invention.

FIG. 9 is a block diagram showing a magnetic resonance imaging apparatus according to an exemplary embodiment of the present invention.

A magnetic resonance imaging apparatus 20 includes a static field magnet 21 for generating a static magnetic field, a shim coil 22 arranged inside the static field magnet 21 which is cylinder-shaped, a gradient coil 23 and an RF coil 24. The static field magnet 21, the shim coil 22, the gradient coil 23 and the RF coil 24 are built in a gantry (not shown).

The magnetic resonance imaging apparatus 20 also includes a control system 25. The control system 25 includes a static magnetic field power supply 26, a gradient power supply 27, a shim coil power supply 28, a transmitter 29, a receiver 30, a sequence controller 31 and a computer 32. The gradient power supply 27 of the control system 25 includes an X-axis gradient power supply 27x, a Y-axis gradient power supply 27y and a Z-axis gradient power supply 27z. The computer 32 includes an input device 33, a display unit 34, an operation unit 35 and a storage unit 36.

The static field magnet 21 communicates with the static magnetic field power supply 26. The static magnetic field power supply 26 supplies electric current to the static field magnet 21 to get the function to generate a static magnetic field in an imaging region. The static field magnet 21 includes a superconductivity coil in many cases. The static field magnet 21 gets current from the static magnetic field power supply 26 which communicates with the static field magnet 21 at excitation. However, once excitation has been made, the static field magnet 21 is usually isolated from the static magnetic field power supply 26. The static field magnet 21 may include a permanent magnet which makes the static magnetic field power supply 26 unnecessary.

The static field magnet 21 has the cylinder-shaped shim coil 22 coaxially inside itself. The shim coil 22 communicates with the shim coil power supply 28. The shim coil power supply 28 supplies current to the shim coil 22 so that the static magnetic field becomes uniform.

The gradient coil 23 includes an X-axis gradient coil 23x, a Y-axis gradient coil 23y and a Z-axis gradient coil 23z. Each of the X-axis gradient coil 23x, the Y-axis gradient coil 23y and the Z-axis gradient coil 23z which is cylinder-shaped is arranged inside the static field magnet 21. The gradient coil 23 also has a bed 37 in the area formed inside it which is an imaging area. The bed 37 supports an object P. Around the bed 37 of the object P, the RF coil 24 may be arranged instead of being built in the gantry.

The gradient coil 23 communicates with the gradient power supply 27. The X-axis gradient coil 23x, the Y-axis gradient coil 23y and the Z-axis gradient coil 23z of the gradient coil 23 communicate with the X-axis gradient power supply 27x, the Y-axis gradient power supply 27y and the Z-axis gradient power supply 27z of the gradient power supply 27, respectively.

The X-axis gradient power supply 27x, the Y-axis gradient power supply 27y and the Z-axis gradient power supply 27z supply currents to the X-axis gradient coil 23x, the Y-axis gradient coil 23y and the Z-axis gradient coil 23z, respectively, so as to generate gradient magnetic fields Gx, Gy and Gz in the X, Y and Z directions in the imaging area.

The RF coil 24 communicates with the transmitter 29 and the receiver 30. The RF coil 24 has a function to transmit a radio frequency signal given from the transmitter 29 to the object P and receive an NMR signal generated due to a nuclear spin inside the object P which is excited by the radio frequency signal to give to the receiver 30.

The sequence controller 31 of the control system 25 communicates with the gradient power supply 27, the transmitter 29 and the receiver 30. The sequence controller 31 has a function to storage sequence information describing control information needed in order to make the gradient power supply 27, the transmitter 29 and the receiver 30 drive and generate gradient magnetic fields Gx, Gy and Gz in the X, Y and Z directions and a radio frequency signal by driving the gradient power supply 27, the transmitter 29 and the receiver 30 according to a predetermined sequence stored. The control information above-described includes motion control information, such as intensity, impression period and impression timing of the pulse electric current which should be impressed to the gradient power supply 27.

The sequence controller 31 is also configured to give raw data to the computer 32. The raw data is complex number data obtained through the detection of an NMR signal and A/D conversion to the NMR signal detected in the receiver 30.

The transmitter 29 has a function to give a radio frequency signal to the RF coil 24 in accordance with control information provided from the sequence controller 31. The receiver 30 has a function to generate raw data which is digitized complex number data by detecting an NMR signal given from the RF coil 24 and performing predetermined signal processing and A/D converting to the NMR signal detected. The receiver 30 also has a function to give the generated raw data to the sequence controller 31.

The computer 32 gets various functions by the operation unit 35 executing some programs stored in the storage unit 36 of the computer 32. The computer 32 may include some specific circuits instead of using some of the programs.

Figure 10:
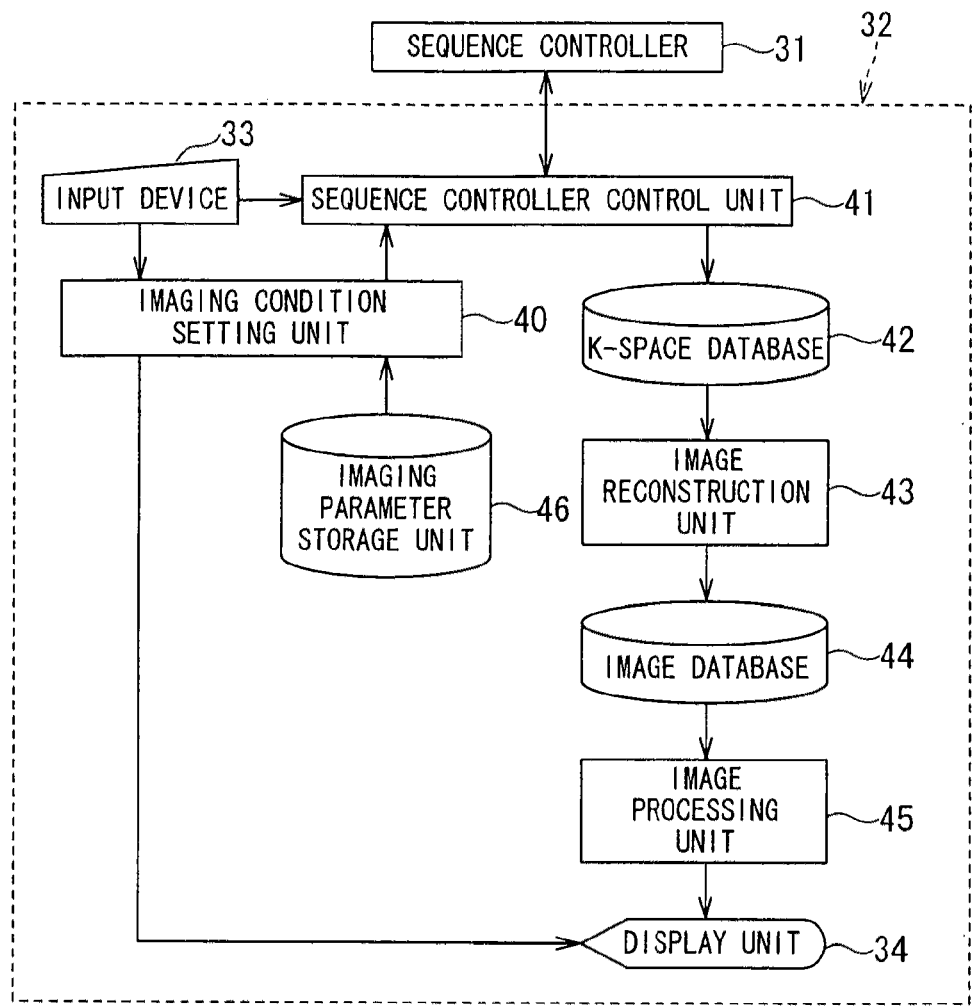
FIG. 10 is a functional block diagram of the computer shown in FIG. 9.

FIG. 10 is a functional block diagram of the computer 32 shown in FIG. 9.

The computer 32 functions as an imaging condition setting unit 40, a sequence controller control unit 41, a k-space database 42, an image reconstruction unit 43, an image database 44, an image processing unit 45 and an imaging parameter storage unit 46 by program.

The imaging condition setting unit 40 has a function to set an imaging condition such as a pulse sequence based on instruction information from the input device 33 and provides the set imaging condition to the sequence controller control unit 41. Therefore, the imaging condition setting unit 40 has a function as an interface to display screen information for setting an imaging condition on the display unit 34. A GUI (Graphical User Interface) technology can be used in order to provide the interface function mentioned above with the imaging condition setting unit 40.

Specifically, the imaging condition setting unit 40 is configured to be able to set a pulse sequence with applications of plural different types of frequency selective fat saturation pulses or plural same type of frequency selective fat saturation pulses under mutually different conditions such as center frequencies and/or frequency bandwidths (r lengths), as an imaging condition. The conditions such as combination of types and/or the number of fat saturation pulses and center frequencies and frequency bandwidths (τ lengths) of fat saturation pulses are determined so that the suppression effect of fat signals improves.

Figure 11:
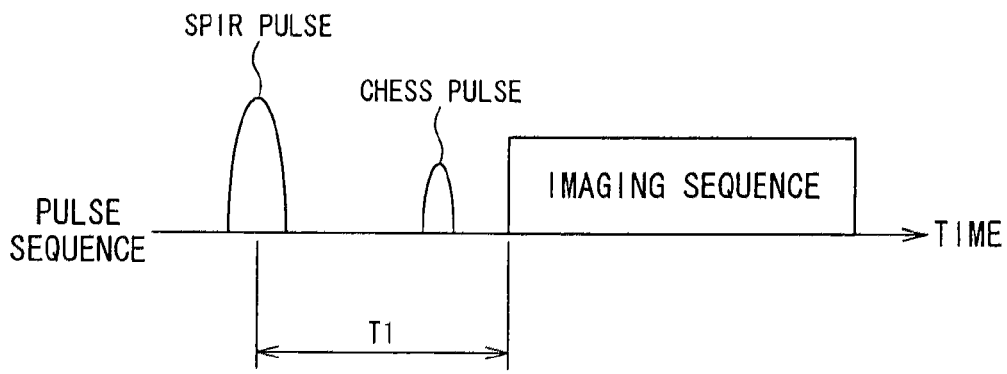
FIG. 11 is a diagram showing a pulse sequence while applying an SPIR pulse and a CHESS pulse settable by the imaging condition setting unit shown in FIG. 10.

FIG. 11 is a diagram showing a pulse sequence while applying an SPIR pulse and a CHESS pulse settable by the imaging condition setting unit 40 shown in FIG. 10.

In FIG. 11, the abscissa denotes time. As shown in FIG. 11, a pulse sequence with application of an SPIR pulse and a CHESS pulse, for example, as different types of fat saturation pulses can be set in the imaging condition setting unit 40. An imaging sequence which is a pulse sequence for data acquisition is set subsequently to applications of the SPIR pulse and the CHESS pulse. The pulse sequence for data acquisition may be a two-dimensional (2D) sequence or a three-dimensional (3D) sequence and can be set as an arbitrary type of pulse sequence such as an FE (field echo) sequence, an SE (spin echo) sequence, an FSE (fast SE) sequence, a half-Fourier FSE sequence, an EPI (echo planar imaging) sequence, and an FFE (Fast FE) sequence. Note that a half-Fourier FSE sequence using a half-Fourier method is also called FASE (fast advanced SE or fast asymmetric SE) sequence.

The application orders of the SPIR pulse and the CHESS pulse are arbitrary. Note that the SPIR pulse is applied at the earlier timing by a TI than the start of the imaging sequence. Therefore, if the CHESS pulse is applied in the period of the TI subsequently to an application of the SPIR pulse, an imaging time can be shortened.

Figure 12:
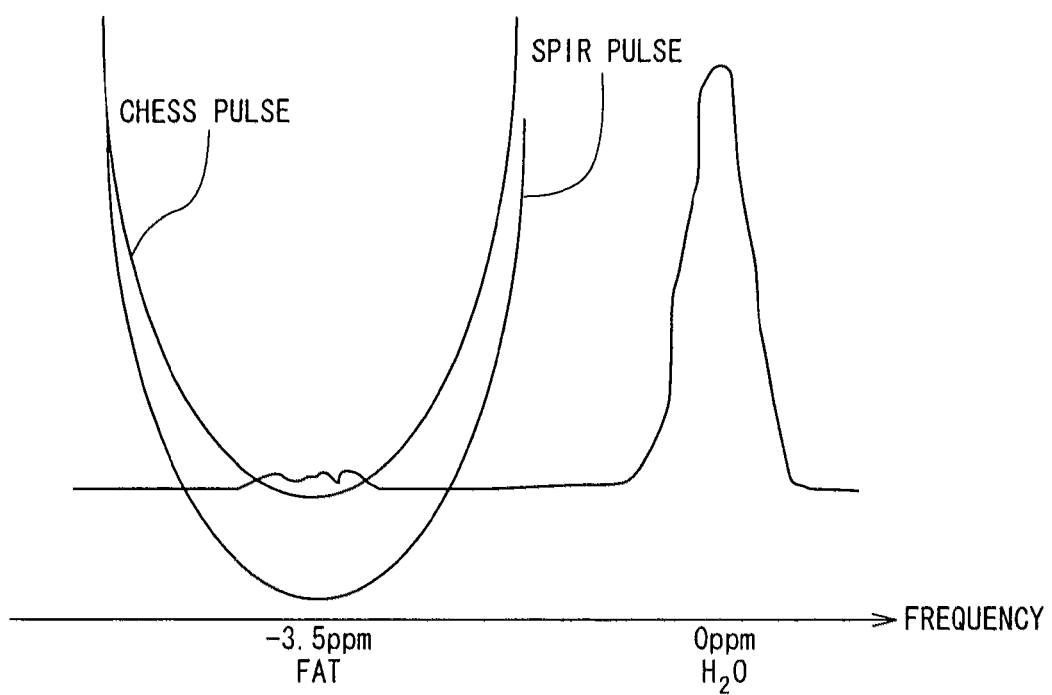
FIG. 12 is a diagram explaining a fat-saturation effect by applying the SPIR pulse and the CHESS pulse shown in FIG. 11.

FIG. 12 is a diagram explaining a fat-saturation effect by applying the SPIR pulse and the CHESS pulse shown in FIG. 11.

In FIG. 12, the abscissa denotes a frequency and the ordinate denotes a signal intensity of an acquired NMR signal. As shown in FIG. 12, the respective resonant frequencies of fat and water have 3.5 ppm difference. When an SPIR pulse which is a fat saturation pulse with a FA from 90 degrees to 180 degrees is applied while matching the frequency of the SPIR pulse to a resonant frequency of fat, fat signals in a wider frequency band can be suppressed than that in a case of applying a CHESS pulse. A FA and TI of the SPIR pulse are adjusted so that a longitudinal magnetization of fat becomes the null point due to T1 relaxation at start timing of the imaging sequence, i.e., application timing of an RF pulse for excitation of water signals, for example.

However, in the case that the adjustments of the FA and TI of the SPIR pulse are insufficient, the longitudinal magnetization of fat does not become the null point with only application of the SPIR pulse when the RF pulse for excitation of water signals is applied. Consequently, fat signals remain. Therefore, fat signals remaining by applying the SPIR pulse are suppressed by an application of the CHESS pulse. In this case, a frequency of the CHESS pulse is set to the resonant frequency of fat as well as a frequency of the SPIR pulse.

Note that when the frequency of the SPIR pulse does not match with the resonant frequency of fat signals, a center frequency of remaining fat signals is different from the center frequency of the SPIR pulse or fat signals remaining outside of a frequency band to be able to be suppressed by the SPIR pulse. In the case mentioned above, the respective frequencies of the SPIR pulse and the CHESS pulse may be set to be mutually different. In addition, not only the respective frequencies of the SPIR pulse and the CHESS pulse, but also the respective frequency bandwidths (τ lengths) thereof, can be set to be mutually different so as to suppress fat signals more satisfactorily depending on a spectral form of remaining fat signals.

That is, when adjustment of the TI is insufficient, to make the frequency of the SPIR pulse match to that of the CHESS pulse is efficient on a fat saturation. On the contrary, when adjustment of the TI is satisfactory, there is a possibility to improve fat saturation effect if the respective frequencies of the SPIR pulse and the CHESS pulse are set to be mutually different values.

Thus, when respective applications of the SPIR pulse and the CHESS pulse are combined, only fat signals over a wide range of a frequency band are excited to be generally suppressed by the SPIR pulse with a large FA, and fat signals beyond suppression can be suppressed by the CHESS pulse with a 90 degree FA. This allows suppressing fat signals sufficiently.

As another merit in applications of plural fat saturation pulses like the SPIR pulse and the CHESS pulse, a magnetization variation in fat decreases according to the application number of a fat saturation pulse, and signals from fat become stable by applying a fat saturation pulse plural times. Therefore, whether or not adjustment of the TI is enough, the effect of stabilization of fat signals can be obtained by making the frequency of the SPIR pulse match to the frequency of the CHESS pulse. In addition, as well as a combination of the SPIR pulse and the CHESS pulse, even if plural fat saturation pulses are configured with only SPIR pulses or only CHESS pulses, the effect of stabilization of fat signals can be obtained.

Figure 13:
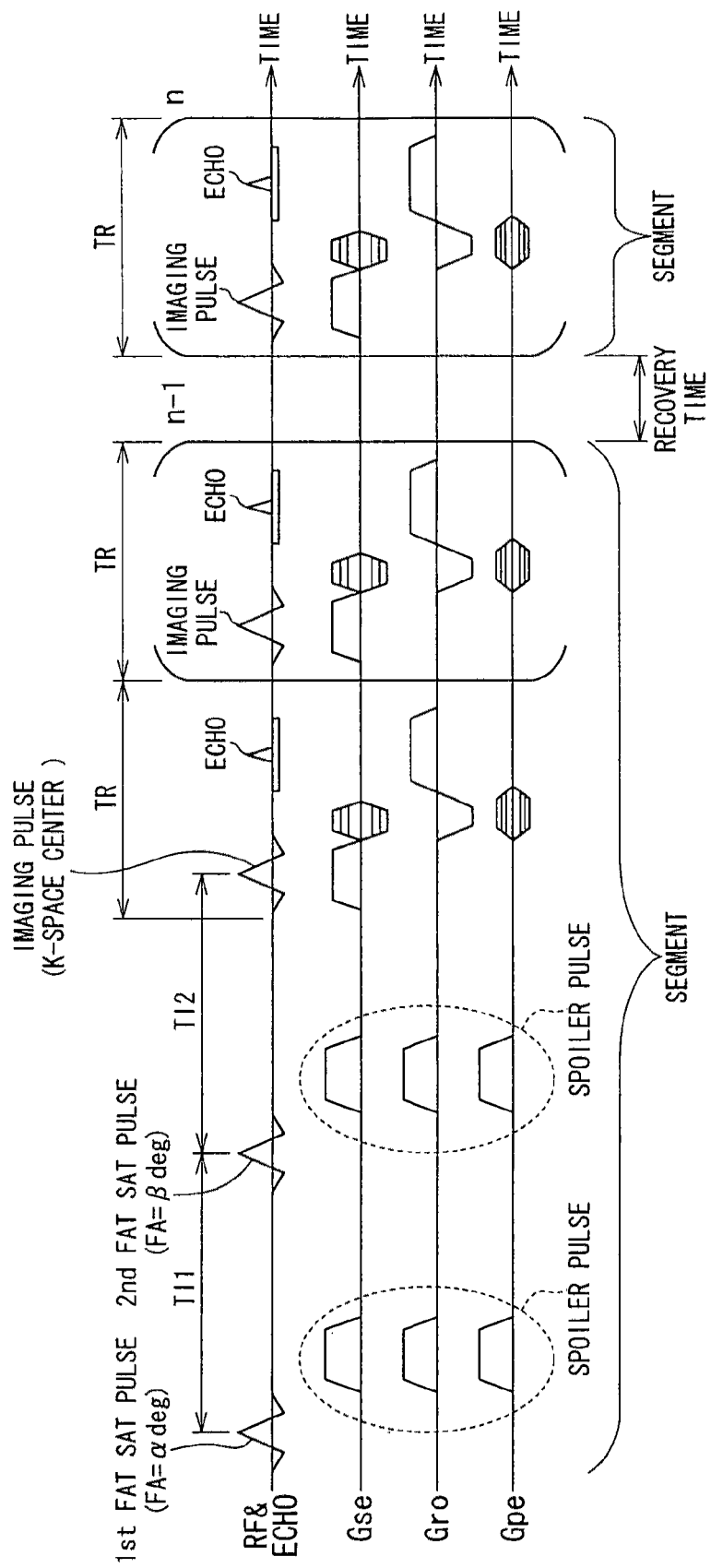
FIG. 13 is a diagram showing a concrete example of pulse sequence while applying plural fat-saturation pulses settable by the imaging condition setting unit shown in FIG. 10.

FIG. 13 is a diagram showing a concrete example of pulse sequence while applying plural fat-saturation pulses settable by the imaging condition setting unit 40 shown in FIG. 10.

In FIG. 13, the abscissa denotes time, RF&ECHO denotes RF pulses and echo signals, Gse denotes gradient magnetic field pulses for SE (slice encode), Gro denotes gradient magnetic field pulses for RO (readout), and Gpe denotes gradient magnetic field pulses for PE (phase encode).

As shown in FIG. 13, the second fat saturation pulse (2nd fat sat pulse) with a β-degree FA to tilt the magnetization of fat is applied at the timing to pass the time TI1 from the first fat saturation pulse (1st fat sat pulse) with an α-degree FA to tilt the magnetization of fat. The gradient magnetic field spoiler pulses to defuse transverse magnetizations respectively are applied subsequently to applying the first and the second fat saturation pulses. As described below, the gradient magnetic field spoiler pulse may be applied only after applying the second fat saturation pulse. An imaging sequence is set subsequently to applications of the first and the second fat saturation pulses.

FIG. 13 shows an example of setting a three-dimensional multi-slice FFE sequence to perform data acquisition under the segment k-space method as the imaging sequence. Therefore, a sequence to acquire data in each segment is repeated at an interval of an adjustment time (recovery time). That is, there is a space time which is the recovery time among data acquisition sequences corresponding to respective segments. The data acquisition in a common segment is performed by a sequence to repeat application of an imaging pulse n times with a repetition time (TR). Then, echo signals are acquired subsequently to applying imaging pulses. An imaging pulse is an excitation pulse for exciting magnetization of water and, therefore, the acquired echo signal is an echo signal from water.

Although the first fat saturation pulse and the second fat saturation pulse can be applied respectively precedent to data acquisition of each segment, as shown in FIG. 13, applying the first fat saturation pulse and the second fat saturation pulse only precedent to data acquisition of a specific segment leads to reduction of an imaging period. Preferably, the pulse sequence is set so that the second fat saturation pulse is applied at the timing before the period TI2 from an application time of an imaging pulse to acquire data near the center of k-space. By doing this, increase of an imaging period can be suppressed while performing a sufficient fat saturation to data, near the center of k-space, to which more satisfactory fat saturation effect is required.

Therefore, when the imaging sequence is a three-dimensional FFE sequence, it is preferable to use a sequence to perform data acquisition from the vicinity of the center of k-space at the beginning, such as interleave acquisition or centric acquisition.

The interleave acquisition is a data acquisition method to acquire data from the vicinity of the center in k-space toward the edge in a PE direction and to acquire data from the edge linearly in a SE direction. The centric acquisition is a data acquisition method to acquire data from the vicinity of the center in k-space toward the edge in the both directions of PE and SE. Note that, as another data acquisition method, the sequential acquisition to acquire data from the edge of k-space linearly in both directions of PE and SE is known.

Here, a determination method of a FA will be described.

Figure 14:
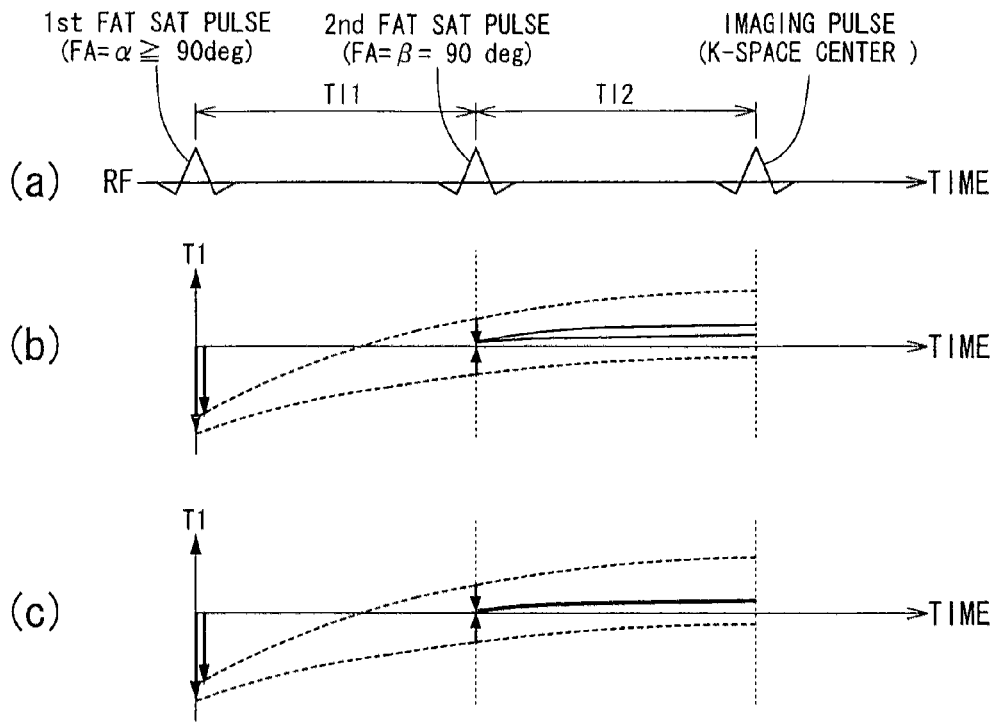
FIGS. 14(a), 14(b) and 14(c) are diagrams explaining a method for setting each FA of the first fat-saturation pulse and the second fat-saturation pulse set by the imaging condition setting unit shown in FIG. 10.

FIGS. 14(a), 14(b) and 14(c) are diagrams explaining a method for setting each FA of the first fat-saturation pulse and the second fat-saturation pulse set by the imaging condition setting unit 40 shown in FIG. 10.

FIG. 14(a) shows the first fat-saturation pulse, the second fat-saturation pulse and an imaging pulse, for acquiring data on the center of k-space, applied subsequently to the second fat-saturation pulse. FIG. 14(b) shows a variation of T1 in case of each part having a mutually different T1 value in fat and T1 relaxing. FIG. 14(c) shows a variation of T1 in case where apparent a T1 shows plural different values due to non-uniform RF pulses although a T1 value of fat is constant.

As shown in FIG. 14(a), after the first fat saturation pulse is applied, in the case that T1 values are mutually different even in a fat region due to the influence of surrounding tissues, mutually different T1 relaxations occur as shown in FIG. 14(b). As shown in FIG. 14(c), in the case that apparent T1 values are mutually different due to an uneven RF pulse even if T1 values are same, mutually different T1 relaxations occur.

Therefore, when the FA of the first fat saturation pulse is set at 90 degrees or more)($\alpha \geqq 90°$ so that the T1 becomes the null point by applying the second fat saturation pulse at the timing to pass the period TI1 subsequently to application of the first fat saturation pulse, mutually different T1 relaxations can be cancelled once. That is, as shown in FIG. 14(b), even if TI values of fat are mutually different in each region, the difference between longitudinal magnetizations is reduced by an application of the second fat saturation pulse and non-uniformity of fat saturation is improved. As shown in FIG. 14(c), even if an application of an uneven RF pulse results in a difference between longitudinal magnetizations, T1 recoveries without a difference can be obtained by applying the second fat saturation pulse.

The FA of the first fat saturation pulse is set to a large angle from approximately 100 degrees to 130 degrees ($\alpha$=100-130 degrees), for example, since the T1 becomes the null point by the application of the second fat saturation pulse. That is to say, the FA of the first fat saturation pulse can be determined according to the period TI1 between the application times of the first fat saturation pulse and the second fat saturation pulse so that the T1 becomes the null point at the center of a waveform of the second fat saturation pulse. In addition, the FA of the first fat saturation pulse can be adjusted in the range from 90 degrees to 180 degrees according to the degree of suppression of fat signals. Then, the first fat saturation pulse to tilt a magnetization of fat into an angle from 90 degrees to 180 degrees can be set.

When the period TI2 from the application time of the second fat saturation pulse until the application time of the imaging pulse to acquire data near the center in k-space is sufficiently short, even if the FA of the second fat saturation pulse is set to 90 degrees) $\beta$=90°, sufficient fat saturation effect can be obtained at the application timing of the imaging pulse. Therefore, the second fat saturation pulse to tilt a magnetization of fat by 90 degrees can be set. In an FFE sequence to obtain a T1 weighted image by the interleave acquisition or the centric acquisition, the period TI2 from an application time of the second fat saturation pulse until an application time of the imaging pulse to acquire data near the center in k-space is sufficiently short. Then, the shorter the period TI2 mentioned above is, the more fat saturation effect improves by reducing the recovery of fat signals.

On the other hand, when the period TI2 from an application time of the second fat saturation pulse until an application time of the imaging pulse to acquire data near the center in k-space is not sufficiently short, satisfactory fat saturation effect can be obtained at application timing of the imaging pulse if $\beta$-degree FA of the second fat saturation pulse is set so that the T1 becomes the null point at the application time of the imaging pulse.

Though the imaging sequence shown in FIG. 13 is an FFE sequence, when the imaging sequence is a sequence to obtain a T2 (transverse relaxation) weighted image such as an FE sequence, an SE sequence, an FSE sequence, and an FASE sequence, it is preferable to set the FA $\beta$ of the second fat saturation pulse so that the T1 becomes the null point at the application time of the imaging pulse since the period TI2 from the application time of the second fat saturation pulse to the application time of the imaging pulse to acquire data near the center in k-space is long generally. In the case of performing the sequential acquisition by an FFE sequence, since the period TI2 from the application time of the second fat saturation pulse to an application time of the imaging pulse to acquire data near the center in k-space is long, it is also preferable to set the FA $\beta$ of the second fat saturation pulse so that the T1 becomes the null point at the application time of the imaging pulse.

That is to say, it is preferable that the FA $\beta$ of the second fat saturation pulse be set to an appropriate value according to a type of an imaging sequence.

Figure 15:
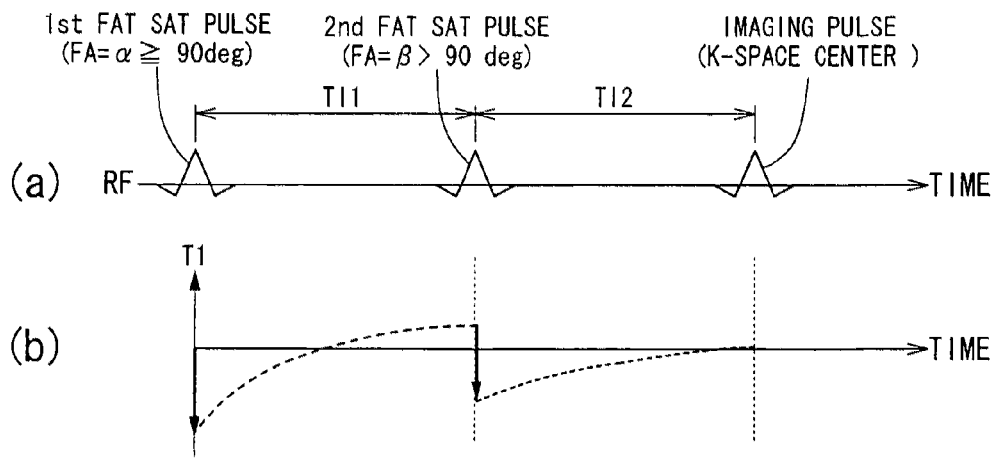
FIGS. 15(a) and 15(b) are diagrams explaining another method for setting each FA of the first fat-saturation pulse and the second fat-saturation pulse set by the imaging condition setting unit shown in FIG. 10.

FIGS. 15(a) and 15(b) are diagrams explaining another method for setting each FA of the first fat-saturation pulse and the second fat-saturation pulse set by the imaging condition setting unit 40 shown in FIG. 10.

FIG. 15(a) shows the first fat-saturation pulse, the second fat-saturation pulse and an imaging pulse, for acquiring data on the center of k-space, applied subsequently to the second fat-saturation pulse. FIG. 15(b) shows a variation of T1 in case of fat T1-relaxing with a constant T1 value.

When the imaging sequence is a sequence to obtain a T2 weighted image such as an FSE sequence or an FFE sequence to perform the sequential acquisition, the period TI2 from an application time of the second fat saturation pulse to an application time of the imaging pulse to acquire data near the center in k-space becomes long. In this case, when the FA $\beta$ of the second fat saturation pulse is set to 90 degrees, there is a possibility that fat signals recover subsequently to the application of the second fat saturation pulse and a recovery amount of fat signals cannot be ignored at the point of an application of the imaging pulse. Therefore, as shown in FIGS. 15(a) and 15(b), it is preferable that the FA $\beta$ of the second fat saturation pulse be set to over 90 degrees) ($\beta>90°$) and the T1 value becomes the null point at application timing of the imaging pulse.

In this case, the FA $\beta$ of the second fat saturation pulse is determined according to respective values of the FA $\alpha$ of the first fat saturation pulse, the period TI1 between application times of the first fat saturation pulse and the second fat saturation pulse, and the period TI2 between application times of the second fat saturation pulse and the imaging pulse. The FA $\beta$ of the second fat saturation pulse is also determined depending on the T1 value of fat. Therefore, the FA $\beta$ of the second fat saturation pulse is obtained as $\beta=F$ ($\alpha$, TI1, TI2, T1 value) using a function F. That is to say, parameters $\alpha$, $\beta$, TI1, TI2 can be adjusted so that the T1 value becomes the null point at an application time of the imaging pulse.

A specific example of each FA is to apply an SPIR pulse with a 150 degree FA ($\alpha=150°$ as the first fat saturation pulse and to apply a CHESS pulse with a 95 degree FA (($\beta=95°$ as the second fat saturation pulse when an FSE sequence is used for data acquisition.

Incidentally, three fat saturation pulses or above can be also applied. While increase of an imaging period can be suppressed to the minimum when the number of fat saturation pulses is set to two, when the number of fat saturation pulses is set to three or more, fat saturation effect can be improved by stability of fat signals. Then, the determination methods of each FA as described above can be used similarly in the case of using three fat saturation pulses or more.

Figure 16:
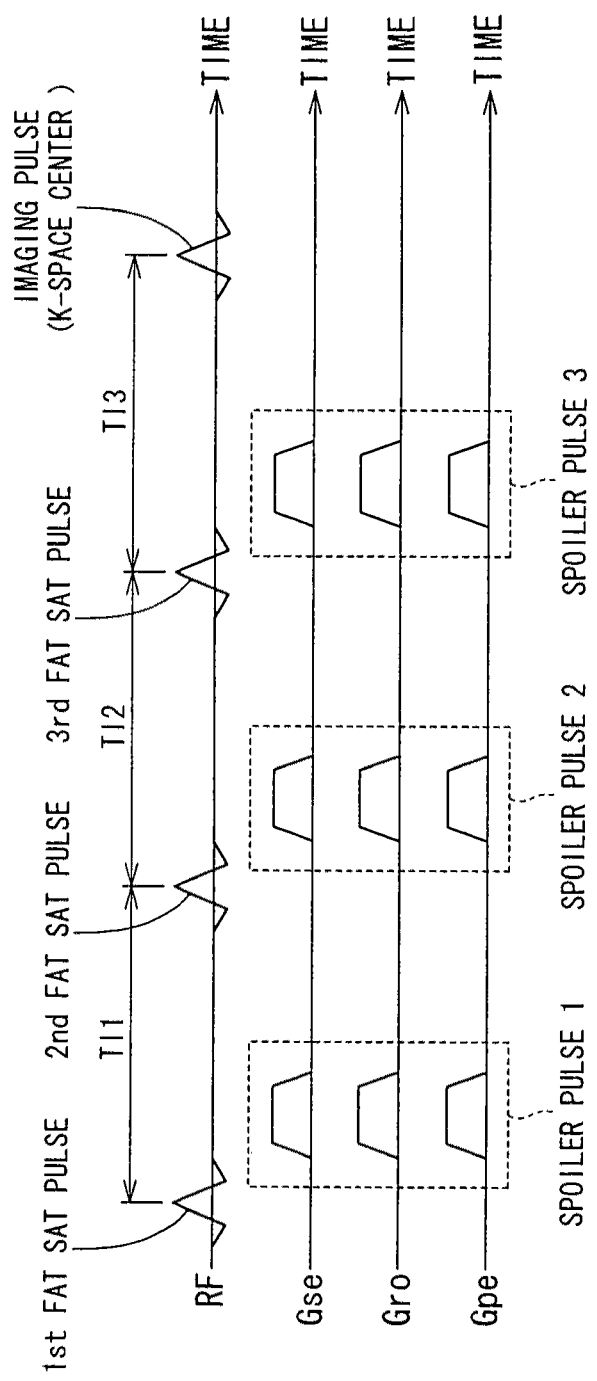
FIG. 16 is a diagram showing an example of sequence while applying three fat-saturation pulses set by the imaging condition setting unit shown in FIG. 10.

FIG. 16 is a diagram showing an example of sequence while applying three fat-saturation pulses set by the imaging condition setting unit 40 shown in FIG. 10.

In FIG. 16, the abscissa denotes time, RF denotes RF pulses, Gse denotes gradient magnetic field pulses for slice encode, Gro denotes gradient magnetic field pulses for readout, and Gpe denotes gradient magnetic field pulses for phase encode.

As shown in FIG. 16, it is also possible to apply the second fat saturation pulse after passing the period TI1 from an application of the first fat saturation pulse and, furthermore, to apply the third fat saturation pulse after passing the period TI2 from an application of the second fat saturation pulse. Then, an imaging pulse to acquire data near the center in k-space is applied after passing the period TI3 from the application of the third fat saturation pulse. Gradient magnetic field spoiler pulses to suppress unnecessary transverse magnetization elements are applied subsequently to application of each fat saturation pulse.

Note that the gradient magnetic field spoiler pulses applied after the first and the second fat saturation pulses may be omitted. That is, an imaging period can be reduced while maintaining the suppression effect of a transverse magnetization to some extent by applying a gradient magnetic field spoiler pulse only subsequently to the application of the last fat saturation pulse.

As shown in FIG. 16, when multiple fat saturation pulses are applied, the merit of stability of fat signals can be obtained since a fat saturation state is repeated, the variation of a magnetization of fat becomes small gradually, and a steady state can be obtained.

When three or more fat saturation pulses are applied, the FA of every fat saturation pulse or each fat saturation pulse after the second can be set to 90 degrees. Note that fat saturation effect can be improved by adjusting appropriately a FA so as to be over 90 degrees, according to fat saturation effect.

It is preferable that every frequency of fat saturation pulses is set to the resonant frequency of fat to improve stability of a magnetization of fat. Note that, when a magnetic field is uneven locally, another peak often appears at a position shifted from the original resonant frequency of fat on a frequency spectrum. In this case, satisfactory fat saturation effect can be obtained by offsetting frequencies of some fat saturation pulses so as to match the frequency corresponding to a peak, even to an uneven magnetic field locally.

Figure 17:
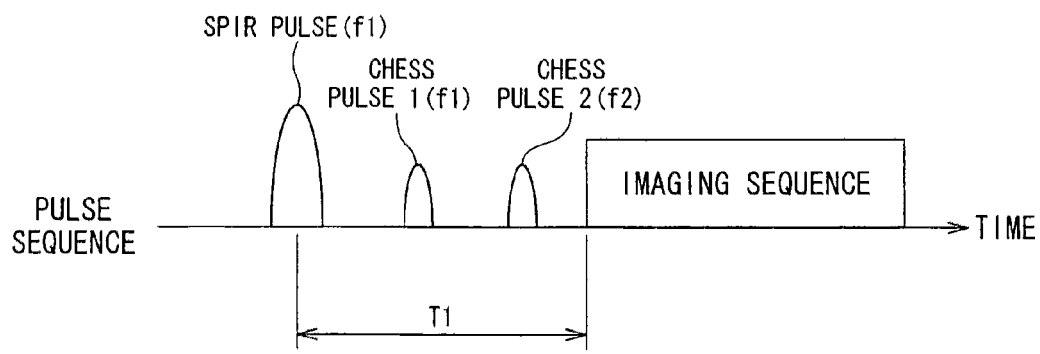
FIG. 17 is a diagram showing a pulse sequence while applying an SPIR pulse and two CHESS pulses having mutually different frequencies settable by the imaging condition setting unit shown in FIG. 10.

FIG. 17 is a diagram showing a pulse sequence while applying an SPIR pulse and two CHESS pulses having mutually different frequencies settable by the imaging condition setting unit 40 shown in FIG. 10.

In FIG. 17, the abscissa denotes time. As shown in FIG. 17, a pulse sequence by which an SPIR pulse and a CHESS pulse as different types of fat saturation pulses and two CHESS pulses having mutually different frequencies as same type of fat saturation pulses having different conditions mutually are applied respectively can be set in the imaging condition setting unit 40. An imaging sequence which is a pulse sequence for data acquisition is set subsequently to applying the SPIR pulse and the two CHESS pulses.

Both of the frequency f1 of the SPIR pulse and the frequency f1 of the CHESS pulse 1, which is one of the two CHESS pulses, are set to a resonant frequency of fat signals and the frequency f2 of the CHESS pulse 2, which is the other CHESS pulse, is set to a different value from the frequency f1 of the SPIR pulse. Note that the respective frequencies of the SPIR pulse and the two CHESS pulses may be set to mutually different frequencies according to a frequency spectral shape of fat signals.

The application order of the SPIR pulse and the two CHESS pulses is arbitrary. Note that the SPIR pulse is applied at the earlier timing by a TI than the beginning of the imaging sequence. Therefore, when the two CHESS pulses are applied during the period TI subsequently to applying the SPIR pulse, the imaging period can be reduced.

Figure 18:
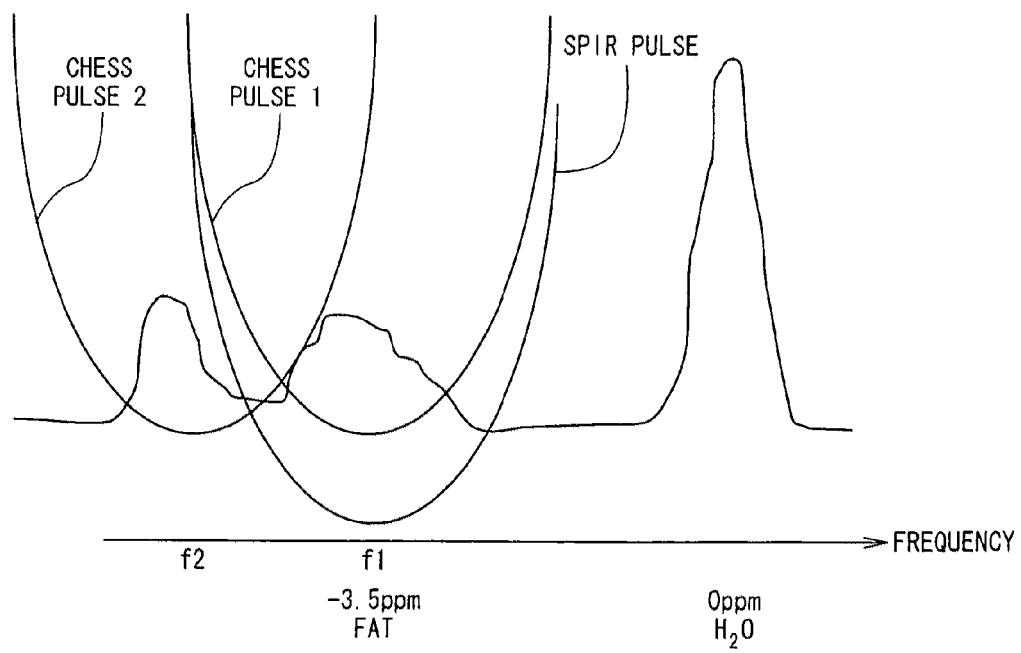
FIG. 18 is a diagram explaining a fat-saturation effect by applying the SPIR pulse and the two CHESS pulses shown in FIG. 17.

FIG. 18 is a diagram explaining a fat-saturation effect by applying the SPIR pulse and the two CHESS pulses shown in FIG. 17.

In FIG. 18, the abscissa denotes a frequency and the ordinate denotes a signal intensity of an acquired NMR signal. For example, there is a case that a static magnetic field is uneven locally like a case to be affected strongly by susceptibility or a case to be affected by shape such as a jaw region and a breast region under the high magnetic field such as 3 T. When a static magnetic field is uneven, as shown in FIG. 18, there is a case that another peak appears at a different frequency from the original resonant frequency by shifting of a resonant frequency of fat signals. In this case, even if the fat signals spreading in the band near the original resonant frequency of fat signals are suppressed by applying the SPIR pulse and the CHESS pulse having a frequency set to the resonant frequency f1 of fat signals as shown in FIG. 12, there is a case that fat signals still remain in another frequency band.

Therefore, the CHESS pulse 2 having the frequency f2 shifted from the resonant frequency of fat signals is applied subsequently to applying the SPIR pulse and the CHESS pulse 1 having the frequency f1 set to the resonant frequency of fat signals. The frequency f2 of the CHESS pulse 2 is set to the value offset from the original resonant frequency of the fat signals so that remaining fat signals after applying the SPIR pulse and the CHESS pulse 1 are sufficiently suppressed. Consequently, even the case that the resonant frequency of fat signals shifts, fat saturation effect can be obtained sufficiently.

Another example of application of plural fat saturation pulses is a case of applying two CHESS pulses. That is, the SPIR pulse may be omitted in the pulse sequence shown in FIG. 17. In this case, when fat signals show plural peaks, fat saturation effect can be improved by setting the respective frequencies of the two CHESS pulses to different values mutually. When the center frequencies of the two CHESS pulses are set to be same, there is the case that fat saturation effect is improved by setting the frequency bandwidths of the two CHESS pulses to be different from each other.

As described above, the imaging condition setting unit 40 can set imaging conditions for an imaging scan to acquire a diagnostic image. In addition, a prescan can be performed separately to obtain a frequency of a CHESS pulse necessary to determine imaging conditions for an imaging scan. A prescan is performed precedent to an imaging scan and performs data acquisition plural times while changing a frequency of a CHESS pulse. The prescan to acquire data while changing a frequency as described above is called a frequency prep scan here.

When a frequency prep scan is performed, the imaging condition setting unit 40 can set an imaging condition for the frequency prep scan.

Figure 19:
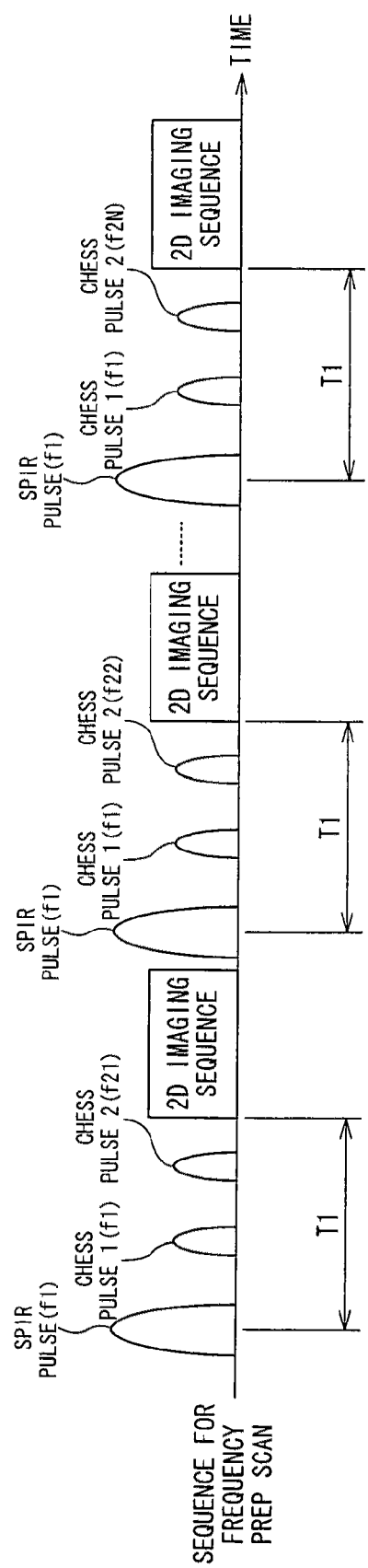
FIG. 19 is a conceptual diagram of a pulse sequence for a frequency prep scan settable by the imaging condition setting unit shown in FIG. 10.

FIG. 19 is a conceptual diagram of a pulse sequence for a frequency prep scan settable by the imaging condition setting unit 40 shown in FIG. 10.

In FIG. 19, the abscissa denotes time. As shown in FIG. 17, when the imaging scan is performed using the pulse sequence with applications of an SPIR pulse and two CHESS pulses having mutually different frequencies, it is necessary to obtain the frequency f2 of the CHESS pulse while offsetting a frequency from the resonant frequency of fat. A pulse sequence for the frequency prep scan to acquire data over N times with changing the frequency f2 of the CHESS pulse while offsetting a frequency from the resonant frequency of fat to f21, f22, . . . , and f2N can be set.

The number N and the variation width of the frequency f2 of the CHESS pulse to be changed can be set arbitrarily by providing instruction information from the input device 33 to the imaging condition setting unit 40.

It is preferable that an imaging sequence in a pulse sequence for a frequency prep scan is equivalent to an imaging sequence in an imaging scan in view of determining an appropriate frequency f2 of the CHESS pulse. Note that it is preferable that a sequence for a frequency prep scan be set to a two-dimensional sequence for reduction of an imaging period.

In a pulse sequence for a frequency prep scan, the applications of an SPIR pulse and/or another CHESS pulse of which frequency is not a determination target may be omitted.

Plural images corresponding to different frequencies of a CHESS pulse are obtained by performing the pulse sequence for the frequency prep scan set above and an appropriate frequency of a CHESS pulse can be determined by selecting the image having most preferable contrast for a user through visual observation, for example.

On the other hand, a frequency of a fat saturation pulse can also be determined based on a frequency spectrum obtained by performing a prescan for acquiring the frequency spectrum without a frequency prep scan. That is, if a frequency spectrum is acquired precedent to an imaging scan for a fat saturation image, a frequency offset of fat signals can be recognized. The offset of a fat saturation pulse can be determined so as to match with the frequency offset of fat signals on the frequency spectrum.

Thus, when the frequency of a fat saturation pulse is determined synchronizing with the frequency offset of fat signals obtained based on a frequency spectrum, the influence of an uneven magnetic field locally can be reduced and fat saturation effect can be obtained with stability.

Offsetting a frequency of fat signals can be performed manually by displaying a frequency spectrum on the display unit 34 and designating the frequency corresponding to the shifted peak of fat signals with the operation of the input device 33. Further, a peak position of fat signals and a shifted frequency of fat signals can be also detected automatically. In the case that a peak position of fat signals is detected automatically, for example, a range in the frequency direction in which the peak of fat signals is estimated to exist is designated based on the peak of water signals and a signal value over a threshold in the designated range is detected. A shift amount of the resonant frequency of fat signals can be detected automatically by measuring a frequency difference between the peak corresponding to the original resonant frequency of fat signals and the other peak.

Note that performing a scan for acquiring a frequency spectrum under a state in which fat signals are suppressed by applying a non-selective inversion recovery (IR) pulse makes it possible to obtain a frequency spectrum having a maximum value equivalent to the peak of water signals. A range for detecting the peak of fat signals in the frequency direction can be set based on the peak of water signals.

The parameters of a fat saturation pulse as described above including a FA, $\alpha$, $\beta$, pulse intervals TI1, TI2, TI3, . . . , a frequency, and a frequency bandwidth ($\tau$ length) can be set manually or automatically by operating the input device 33 through the screen for setting imaging conditions displayed on the display unit 34.

Respective parameters can be obtained for each imaging condition such as a type of sequence, a data acquisition method and/or an imaging region in advance by a test imaging so as to be able to set a parameter or parameters of a fat saturation pulse automatically. In this case, the respective parameters are obtained while relating to one or more imaging conditions such as a type of sequence, a data acquisition method and/or an imaging region. Then, the obtained parameters with regard to a fat saturation pulse are stored in the imaging parameter storage unit 46.

Then, by storing a preferred combination of parameters and/or the optimum parameters related with every imaging region in the imaging parameter storage unit 46, one or more parameters of each fat saturation pulse such as a FA, a pulse interval, a frequency and/or a frequency bandwidth ($\tau$ length) are read from the imaging parameter storage unit 46 to the imaging condition setting unit 40 to be set as imaging conditions automatically only by inputting information for designating an imaging region and selecting a combination of parameters according to a type of sequence and a data acquisition method while operating the input device 33.

For example, there is the case that a frequency of the fat signals not to be suppressed sufficiently depending on a FA of a certain fat saturation pulse, that is, a frequency of a fat saturation pulse to be added is determined. Accordingly, an appropriate frequency of another fat saturation pulse according to each FA of the certain fat saturation pulse can be obtained to each imaging region in advance by a test imaging. Then, it possible to configure so that the imaging condition setting unit 40 determines a frequency of another fat saturation pulse according to a FA of a certain fat saturation pulse as an imaging condition automatically when an imaging region is selected with the operation of the input device 33.

Similarly, it is possible to determine a FA of another fat saturation pulse according to a FA of a certain fat saturation pulse. As another example, a FA and/or a frequency of another fat saturation pulse can be determined according to the period from an application of a certain fat saturation pulse to an application of an excitation pulse.

In addition to this, conditions with regard to a fat saturation pulse include a data region in k-space to be acquired with application of a fat saturation pulse.

Figure 20:
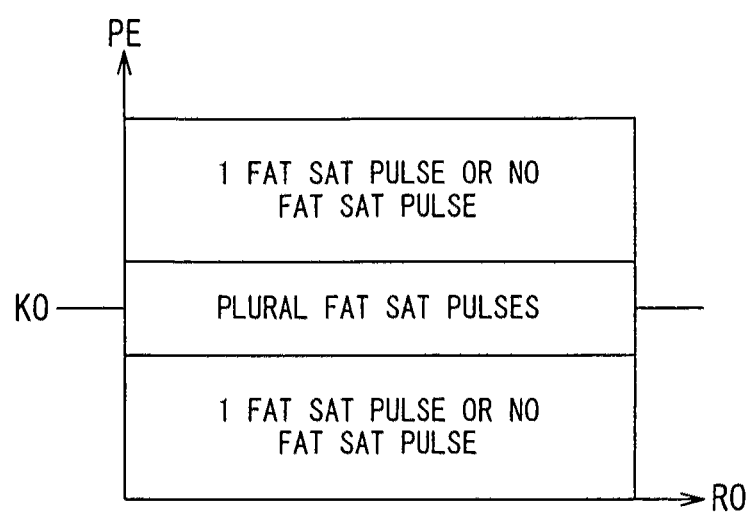
FIG. 20 is a diagram showing regions of data in k-space acquired while applying a fat-saturation pulse settable by the imaging condition setting unit shown in FIG. 10.

FIG. 20 is a diagram showing regions of data in k-space acquired while applying a fat-saturation pulse settable by the imaging condition setting unit 40 shown in FIG. 10.

In FIG. 20, the abscissa denotes RO direction of k-space and the ordinate denotes PE direction of the k-space.

As shown in FIG. 20, data in k-space is divided into data in a low-frequency region near the center (k0) of k-space in the PE direction and data in a high-frequency region at edge part away from the center of k-space in the PE direction. Then, it is in data near the center of k-space that more satisfactory fat saturation effect is desired. By setting imaging conditions so as to acquire only data near the center of k-space with applications of plural fat saturation pulses, on the other hand, so as to acquire data at the part away from the center of k-space without an application of a fat saturation pulse or with an application of one fat saturation pulse, an imaging period can be reduced.

Specifically, when a sequential acquisition is performed with an SE sequence or an FE sequence, there is the case that increase of an imaging period is remarkable by applying plural fat saturation pulses every encode. Then, for example, setting the imaging conditions so as to acquire data near the center of k-space with applications of both an SPIR pulse and a CHESS pulse, on the other hand, so as to acquire data in the region away from the center of k-space with application of only a single SPIR pulse or CHESS pulse makes it possible to suppress increase of an imaging period.

Then, respective imaging conditions as described above can be set with operation of the input device 33 through the screen for setting imaging conditions displayed on the display unit 34.

Figure 21:
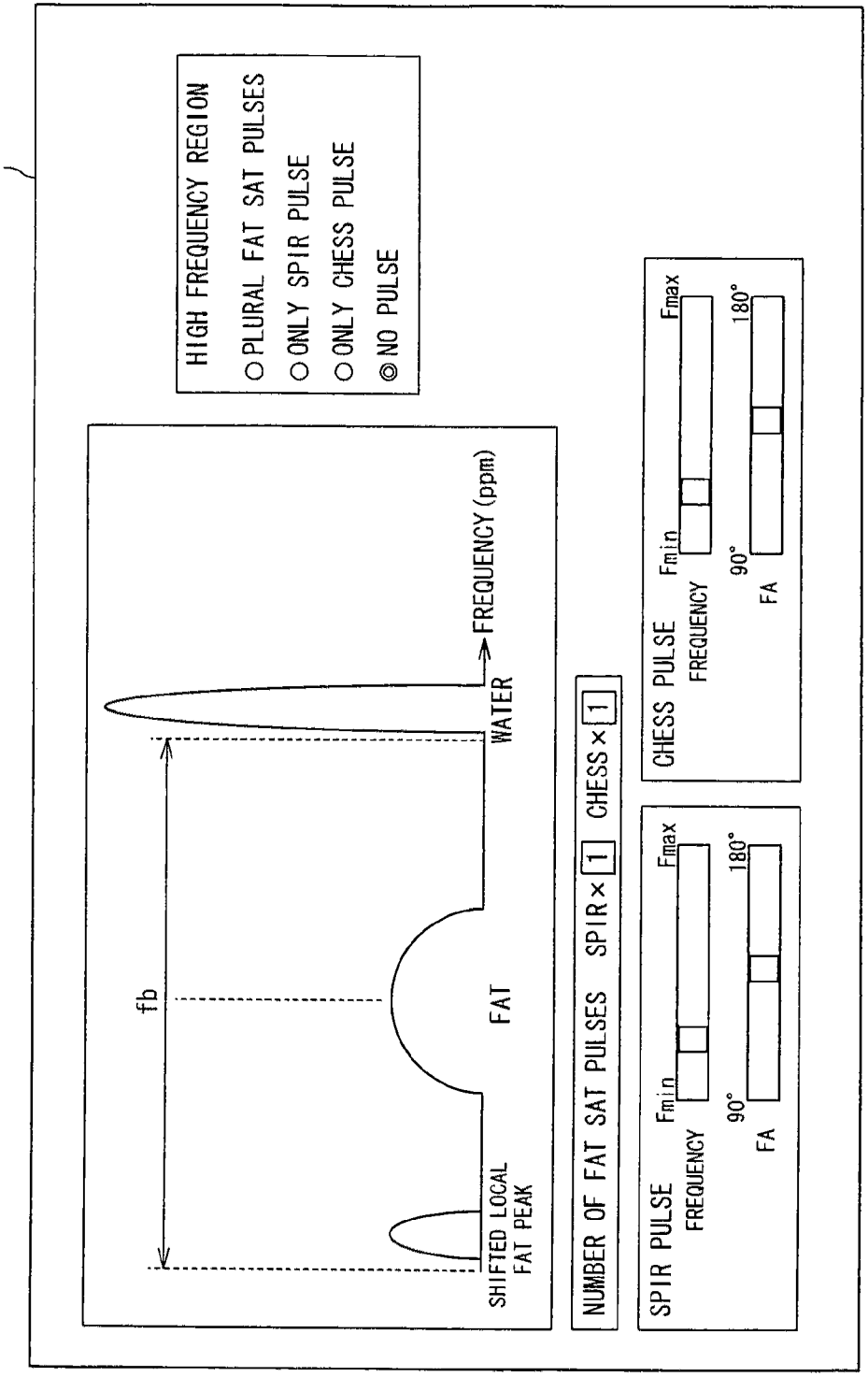
FIG. 21 is a diagram showing an example of imaging condition setting screen displayed on the display unit shown in FIG. 10.

FIG. 21 is a diagram showing an example of imaging condition setting screen displayed on the display unit 34 shown in FIG. 10.

As shown in FIG. 21, the screen for setting imaging conditions is configured by a GUI technology. FIG. 21 shows an example of screen for setting imaging conditions in the case that a center frequency of a fat saturation pulse is set based on the frequency spectrum obtained by a scan for acquiring a frequency spectrum. Therefore, a frequency spectrum obtained by a prescan is displayed on the screen for setting imaging conditions.

When a scan for acquiring a frequency spectrum is performed while suppressing fat signals by applying a non-selective IR pulse, a frequency spectrum having a maximum value equivalent to the peak of water signals as shown in FIG. 21 can be obtained. Then, when a constant frequency band (fb) is set from the peak of water signals and a peak of signals is detected automatically in the set frequency band, a peak of fat signals or a locally shifted peak of fat signals can be detected automatically. A frequency of fat signals detected automatically can be also set automatically as a frequency of a desired fat saturation pulse. Further, a user can also select a frequency corresponding to a peak of fat signals as a frequency of a fat saturation pulse with the input device 33 such as a mouse.

In addition, the number and/or types of fat saturation pulses can be also set arbitrarily. In an example shown in FIG. 21, two fat saturation pulses of an SPIR pulse and a CHESS pulse are set. In addition, a center frequency and a FA of each fat saturation pulse can be adjusted respectively. For example, each of frequency offset and FA of a fat saturation pulse can be set to a desired value by operating a slide bar (scroll bar).

Furthermore, whether or not a fat saturation pulse is applied in a high-frequency region in k-space can be set through a screen for setting imaging conditions. In the example in FIG. 21, an imaging condition in which a fat saturation pulse is not applied in a high-frequency region is selected. In addition to this, as in the case of determining a frequency offset of a fat saturation pulse by performing a frequency prep scan, various types of interface can be generated according to a method of setting imaging conditions.

Then, other functions of the computer 32 will be described.

The sequence controller control unit 41 of the computer 32 has a function for controlling the driving of the sequence controller 31 by giving a pulse sequence, acquired from the imaging condition setting unit 40, to the sequence controller 31 based on information from the input device 33 or another element and a function for receiving raw data which is k-space (Fourier space) data from the sequence controller 31 and arranging the raw data to k-space formed in the k-space database 42.

The image reconstruction unit 43 has a function for generating image data from k-space data by capturing the k-space data from the k-space database 42 and performing image reconstruction processing such as two- or three-dimensional Fourier transform processing to the k-space data, and writing the generated image data to the image database 44.

The image processing unit has a function for performing necessary image processing to image data read from the image database 44 and displaying the image data on the display unit 34.

Next, the operation and action of a magnetic resonance imaging apparatus 20 will be described.

Figure 22:
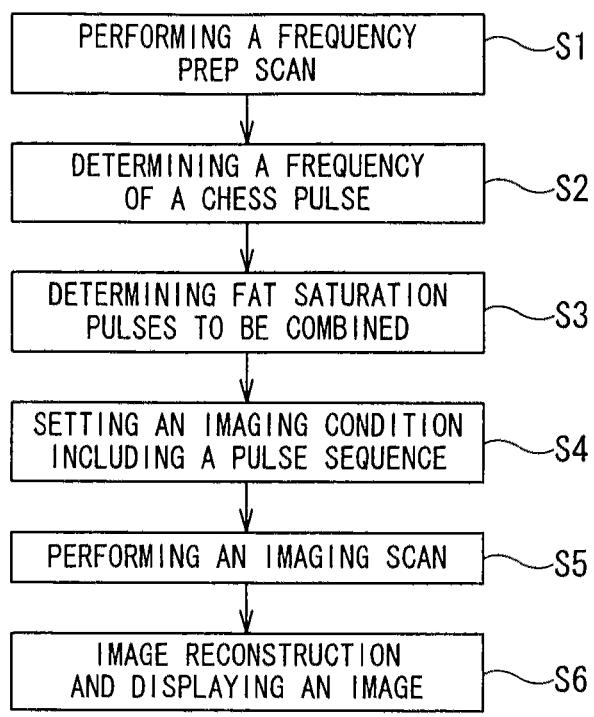
FIG. 22 is a flowchart showing a procedure for imaging a tomographic image of the object with the magnetic resonance imaging apparatus shown in FIG. 9.

FIG. 22 is a flowchart showing a procedure for imaging a tomographic image of the object P with the magnetic resonance imaging apparatus 20 shown in FIG. 9. The symbols including S with a number in FIG. 22 indicate each step of the flowchart.

Here, an example of determining a frequency offset of a fat saturation pulse while performing a frequency prep scan will be described.

First, the object P is set to the bed 37, and a static magnetic field is generated at an imaging area of the magnet 21 (a superconducting magnet) for static magnetic field excited by the static-magnetic-field power supply 26. Further, the shim-coil power supply 28 supplies current to the shim coil 22, thereby uniformizing the static magnetic field generated at the imaging area.

Next, in step S1, a frequency prep scan is performed as needed. A frequency prep scan is efficient when a CHESS pulse is needed to be applied with a frequency shifted from a resonant frequency of fat signals and an appropriate frequency of the CHESS pulse is unknown, as in a case where non-uniformity of a static magnetic field is not improved even by shimming.

Therefore, the imaging conditions including a pulse sequence for a frequency prep scan as shown in FIG. 19 are set. That is, the variation number N and/or the variation width of a frequency f2 of a CHESS pulse is set according to instruction information from the input device 33 in the imaging condition setting unit 40. Then, when a user provides instruction information for performing the frequency prep scan from the input device 33 to the sequence controller control unit 41, the imaging conditions including the pulse sequence for the frequency prep scan are provided to the sequence controller 31 from the imaging condition setting unit 40 through the sequence controller control unit 41.

Then, the sequence controller 31 drives the gradient power supply 27, the transmitter 29, and the receiver 30 in accordance with the sequence for the frequency prep scan, thereby generating a X-axis gradient magnetic field Gx, a Y-axis gradient magnetic field Gy, a Z-axis gradient magnetic field Gz and RF signals. Then, the RF coil 24 receives NMR signals generated due to nuclear magnetic resonance of proton spins in the object P. The receiver 30 receives the NMR signals from the RF coil 24 and generates raw data which is digital data of the NMR signal. The receiver 30 supplies the generated raw data to the sequence controller 31. The raw data is arranged as k-space data in the k-space generated in the k-space database 42 by the sequence controller control unit 41.

The image reconstruction unit 43 reads the k-space data from the k-space database 42 and performs image reconstruction processing to the read k-space data, thereby generating image data. The generated image data is written in the image database 44 by the image reconstruction unit 43. Further, the image processing unit 45 performs necessary image processing to the image data read from the image database 44 and displays the data on the display unit 34.

Consequently, plural fat-saturated images by applying CHESS pulses having mutually different frequencies are displayed on the display unit.

Next, in step S2, when a user selects the image fat-saturated most satisfactory out of the displayed plural images by operation of the input device 33, selection information of the image is provided to the imaging condition setting unit 40 from the input device 33. Then, the frequency of the CHESS pulse corresponding to the selected image is set as a frequency of a CHESS pulse used in an imaging scan in the imaging condition setting unit 40. That is, a frequency of a CHESS pulse is determined.

Then, in step S3, a combination of fat saturation pulses used in the imaging scan is determined. That is, instruction information indicating the conditions including a type, a frequency and a frequency bandwidth of a fat saturation pulse is provided from the input device 33 to the imaging condition setting unit 40.

Then, in step S4, instruction information of an imaging sequence used in the imaging scan is provided from the input device 33 to the imaging condition setting unit 40. Therefore, for example, a pulse sequence with applications of an SPIR pulse and two CHESS pulses which have different frequencies mutually as shown in FIG. 17 is set as an imaging condition for the imaging scan. The frequency f1 of the SPIR pulse and one CHESS pulse is set to the resonant frequency of fat signals and the frequency f2 of the other CHESS pulse is set to the frequency determined by performing the frequency prep scan.

Then, in step S5, the imaging scan is performed. That is, the input device 33 provides an instruction for performing the imaging scan to the sequence controller control unit 41 and the imaging scan is performed under a flow similar to that in case of the frequency prep scan. Consequently, k-space data acquired by the imaging scan is stored in the k-space database 42.

Then, in step S6, the image reconstruction unit 43 generates image data from the k-space data acquired by the imaging scan and an image obtained due to the imaging scan through image processing in the image processing unit 45 is displayed on the display unit 34.

Here, the image shown in the display unit 34 is obtained by suppressing fat signals in a wider frequency band corresponding to the SPIR pulse and by the CHESS pulse suppressing fat signals beyond suppression by the SPIR pulse. Furthermore, even if a static magnetic field is uneven and a resonant frequency of fat signals shifts, fat signals are suppressed by application of the CHESS pulse of which frequency is offset appropriately. Consequently, the image in which fat is suppressed satisfactorily is displayed on the display unit 34.

Figure 23:
FIG. 23 is a tomographic image of the object obtained with fat-saturation by applying an SPIR pulse and a CHESS pulse of which frequencies are set to a resonance frequency of fat signals with the magnetic resonance imaging apparatus shown in FIG. 9.

FIG. 23 is a tomographic image of the object P obtained with fat-saturation by applying an SPIR pulse and a CHESS pulse of which frequencies are set to a resonance frequency of fat signals with the magnetic resonance imaging apparatus 20 shown in FIG. 9.

As shown in FIG. 23, it is confirmed to suppress fat satisfactorily by applications of the SPIR pulse and the CHESS pulse.

That is, the magnetic resonant imaging apparatus 20 described above makes fat saturation effect improved by combining plural fat saturations. For example, fat signals in a wider frequency band can be suppressed by an SPIR pulse and remaining fat signals can be suppressed by a CHESS pulse additionally. For example, applying plural CHESS pulses having mutually different frequencies can make fat saturation effect improved in a region, such as a jaw, in which a resonant frequency of fat signals is shifted due to an uneven static magnetic field.

Therefore, a fat saturation method with combining plural frequency selective fat saturation pulses is a fat saturation method alternative to the STIR method which is a conventional non-frequency selective fat saturation method. In addition, in the STIR method, a dead time T1 during which a longitudinal magnetization of fat protons becomes the null point is needed after applying an excitation pulse. Additionally, signal intensities of water signals become low in order to excite all signals including both fat signals and water signals.

Therefore, a fat saturation method with combining plural frequency selective fat saturation pulses makes it possible to reduce an imaging period and increase intensities of water signals compared to the STIR method.

Further, since the effect to constantly maintain a state in which fat signals are suppressed is obtained by applying fat saturation pulses continuously, a slice profile representing a signal intensity of an excitation pulse to a frequency variation can be improved.

Figure 24:
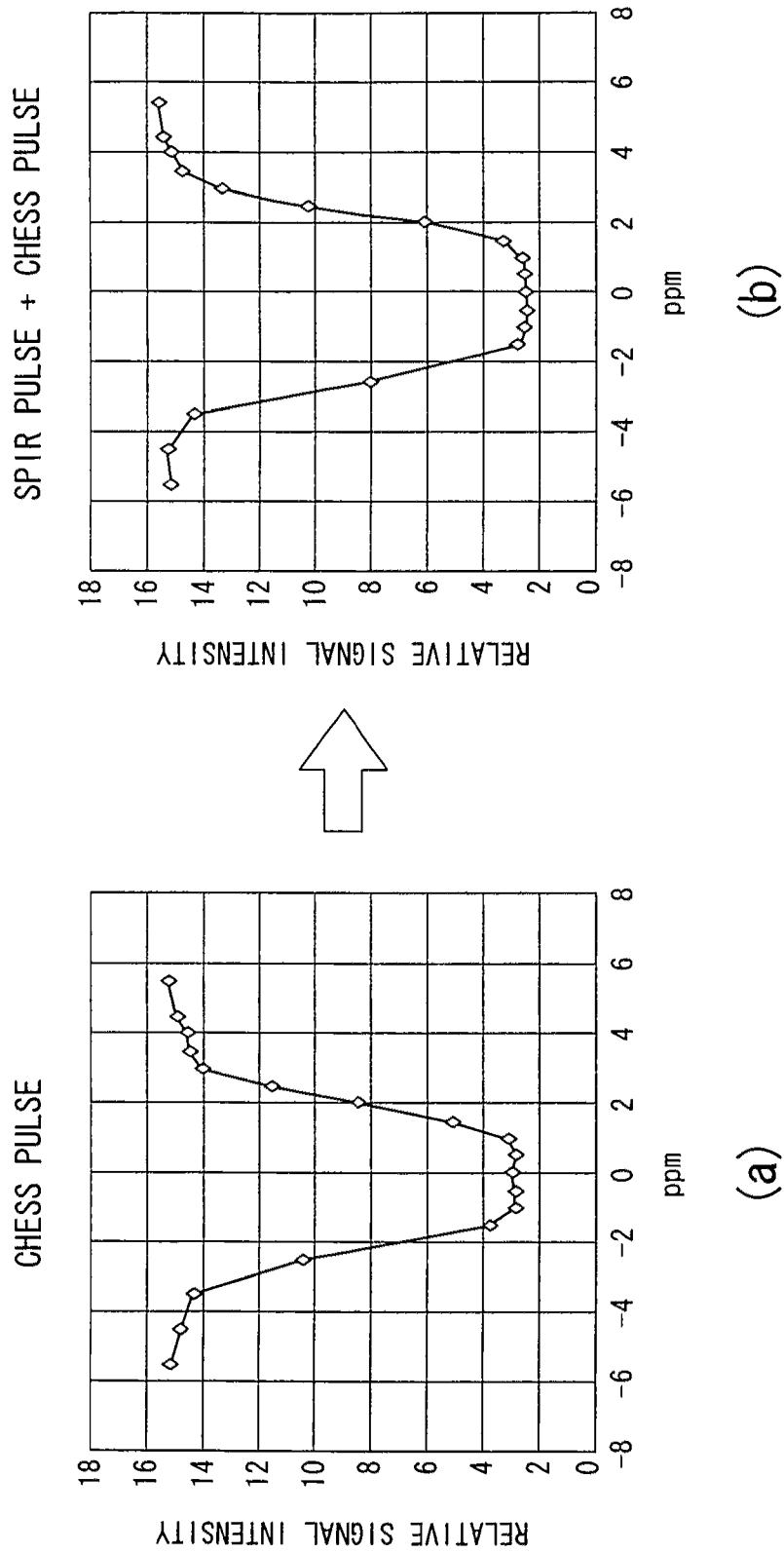
FIGS. 24(a) and 24(b) are diagrams showing a slice profile of signal intensities improved by applying plural fat-saturation pulses with the magnetic resonance imaging apparatus shown in FIG. 9.

FIGS. 24(*a*), 24(*b*) and 24(*c*) are diagrams showing a slice profile of signal intensities improved by applying plural fat-saturation pulses with the magnetic resonance imaging apparatus 20 shown in FIG. 9.

FIG. 24(*a*) shows a slice profile of signal intensities obtained by a conventional fat-saturation method while applying one CHESS pulse. FIG. 24(*b*) shows a slice profile of signal intensities obtained by a fat-saturation method while applying both an SPIR pulse and a CHESS pulse. Therefore, in FIGS. 24(*a*) and 24(*b*), each abscissa denotes a frequency and each ordinate denotes a relative signal intensity.

It can be recognized that a slice profile is improved in a case of applying both an SPIR pulse and a CHESS pulse shown in FIG. 24(*b*) compared to a slice profile in a case of applying one CHESS pulse shown in FIG. 24(*a*).

That is, by applying continuously two fat saturation pulses whether they are the same type or different types, a profile is improved compared to that in a case of applying a single fat saturation pulse. When data acquisition is performed under the segmented k-space method, it is possible to maintain a constant profile without depending on the application interval of a fat saturation pulse varying depending on the number of segments. Consequently, even if the application interval of a fat saturation pulse is short, sufficient saturation effect is favorable. Since suppressed signals do not invert even if a FA of a fat saturation pulse is changed, an uneven suppression is improved.

That is, since a longitudinal magnetization of signals to be desired to be suppressed can reduce sufficiently by applying plural fat saturation pulses continuously in high-speed imaging, the influence of the longitudinal magnetization can be suppressed. Consequently, a profile can be stabilized and it is possible to make fat saturation effect in the frequency direction more uniform. In addition, since influence due to non-uniformity of a magnetic field and an RF pulse can be reduced, a frequency band of suppressed signals can be extended in some degree compared to that in a case of applying one fat saturation pulse.

Note that, in the embodiment described above, although fat signals are suppression targets, plural fat saturation pulses by which target signals from a matter except fat are to be suppressed can be also applied. For example, signals from silicone may be suppression targets and, alternatively, signals not from fat, but water, may be also suppression targets. For example, in a case of performing water saturation, a frequency of a saturation pulse is set to the resonant frequency of water.

A water saturation pulse can be used as a non-selective IR pulse when unnecessary signals from a blood vessel are to be suppressed or when labeling is performed with a Time-SLIP (time spatial labeling inversion pulse) method. The Time-SLIP method is a technology for depicting blood signals as high signals or as low signals by labeling a certain space area with a constant interval.

More specifically, in the Time-SLIP method, a Time-SLIP pulse is applied after a constant delay from an R wave of an ECG (electrocardiogram) signal, as needed. The Time-SLIP pulse consists of an area non-selective IR pulse and an area selective IR pulse. When blood flowing into an imaging area is labeled by an area selective IR pulse, a signal intensity of a part where the blood reaches after a period becomes high and, consequently, blood information can be imaged. When an ECG synchronized imaging is performed, an ECG unit 38 to acquire an ECG signal from the object P is set as shown in FIG. 9. Then, an ECG signal acquired from the ECG unit 38 is used for an ECG synchronized imaging.

What is claimed is:

1. A magnetic resonance imaging apparatus comprising:
an MR imaging condition setting unit configured to set an imaging condition applying a first suppression pulse and a second suppression pulse, said first and second suppression pulses differing from each other in at least one of (a) type, (b) center frequency and (c) frequency band, the first and the second suppression pulses each frequency-selectively suppressing at least one of fat and silicone and each being applied to a specific slice; and
an image data acquisition unit configured to acquire image data according to the imaging condition.

2. The magnetic resonance imaging apparatus according to claim 1,
wherein said MR imaging condition setting unit is configured to set the imaging condition setting the first suppression pulse, the second suppression pulse and a third suppression pulse to an SPIR pulse, a first CHESS pulse having a same frequency as that of the SPIR pulse and a second CHESS pulse having a frequency different from that of the first CHESS pulse, respectively.

3. The magnetic resonance imaging apparatus according to claim 1,
wherein said MR imaging condition setting unit is configured to be able to set an imaging condition for a prescan for plural data acquisitions by changing a frequency of a CHESS pulse used as the first suppression pulse or the second suppression pulse to determine the frequency of the CHESS pulse.

4. A magnetic resonance imaging apparatus comprising:
an MR imaging condition setting unit configured to set an imaging condition applying a first suppression pulse and a second suppression pulse, said first and second suppression pulses differing from each other in at least one of (a) type, (b) center frequency and (c) frequency band, the first and the second suppression pulses each frequency-selectively suppressing target signals and each being applied to a specific slice; and
an image data acquisition unit configured to acquire image data according to the imaging condition.

5. A magnetic resonance imaging method comprising:
performing MR imaging after applying mutually different types of fat-saturation pulses to a specific slice by applying a first suppression pulse and a second suppression pulse, the first and second suppression pulses differing from each other in at least one of (a) type, (b) center frequency and (c) frequency band, the first and the second suppression pulses each frequency-selectively suppressing target signals and each being applied to the specific slice; and
reconstructing an image based on magnetic resonance signals obtained by the MR imaging.

6. A magnetic resonance imaging apparatus comprising:
an MR imaging unit configured to perform imaging applying an excitation pulse for exciting a magnetization of water after applying a first fat-saturation pulse for inclining a magnetization of fat into an angle of 90 degrees to 180 degrees and a second fat-saturation pulse for the magnetization of the fat into an angle of 90 degrees to 180 degrees; and
a reconstruction unit configured to reconstruct an image based on magnetic resonance signals obtained by the imaging.

7. The magnetic resonance imaging apparatus according to claim 6,
wherein said MR imaging unit is configured to apply the excitation pulse at a timing when a longitudinal relaxation of fat signals gets to a null point.

8. The magnetic resonance imaging apparatus according to claim 6, further comprising:
a determining unit configured to set a frequency of the second fat saturation pulse to a frequency determined depending on a flip angle of the first fat-saturation pulse.

9. The magnetic resonance imaging apparatus according to claim 6, further comprising:
a determining unit configured to set a flip angle of the second fat saturation pulse to a flip angle determined depending on a flip angle of the first fat-saturation pulse.

10. The magnetic resonance imaging apparatus according to claim 6, further comprising:
a determining unit configured to set a frequency of the second fat saturation pulse to a frequency determined depending on an interval from application of the first fat-saturation pulse to application of the second fat-saturation pulse.

11. The magnetic resonance imaging apparatus according to claim 6,
wherein said MR imaging unit is configured to determine a flip angle of the first fat-saturation pulse depending on an interval between a time to apply the first fat-saturation pulse and a time to apply the second fat-saturation pulse so as to make a longitudinal magnetization of fat null at a center of a waveform of the second fat-saturation pulse.

12. The magnetic resonance imaging apparatus according to claim 6,
wherein said MR imaging unit is configured to determine a flip angle of the second fat-saturation pulse depending on a type of a sequence used for the imaging.

13. The magnetic resonance imaging apparatus according to claim 6,
wherein said MR imaging unit is configured to determine a flip angle of the second fat-saturation pulse depending on data acquisition method of the magnetic resonance signals.

14. The magnetic resonance imaging apparatus according to claim 6,
wherein said MR imaging unit is configured to perform the imaging by a data acquisition method for acquiring data from near center in k space by using a fast field echo type sequence.

15. The magnetic resonance imaging apparatus according to claim 6,
wherein said MR imaging unit is configured to determine a flip angle of the second fat-saturation pulse so as to make a longitudinal magnetization of fat null at a center of a waveform of an imaging pulse for acquiring data at near center in k-space.

16. The magnetic resonance imaging apparatus according to claim 6,
wherein said MR imaging unit is configured to apply three or more fat-saturation pulses.

17. The magnetic resonance imaging apparatus according to claim 6,
wherein said MR imaging unit is configured to apply a gradient magnetic field spoiler pulse for suppressing a transverse magnetization.

18. The magnetic resonance imaging apparatus according to claim 6, further comprising:
a scan unit configured to acquire a frequency spectrum,
wherein said MR imaging unit is configured to apply at least one of the first fat-saturation pulse and the second fat-saturation pulse with a frequency determined based on the acquired frequency spectrum.

19. The magnetic resonance imaging apparatus according to claim 6,
wherein said MR imaging unit is configured to apply both the first fat-saturation pulse and the second fat-saturation pulse so as to obtain a fat-saturation effect due to both the first fat-saturation pulse and the second fat-saturation pulse only at acquiring data of near center of k space.

20. A magnetic resonance imaging apparatus comprising:
an MR imaging unit configured to perform imaging after applying mutually different types of fat-saturation pulses to a specific slice; and
a reconstruction unit configured to reconstruct an image based on magnetic resonance signals obtained by the imaging.

* * * * *